United States Patent
Matsuoka et al.

(10) Patent No.: US 7,361,248 B2
(45) Date of Patent: Apr. 22, 2008

(54) METHOD FOR FORMING COLOR FILTER, METHOD FOR FORMING LIGHT EMITTING ELEMENT LAYER, METHOD FOR MANUFACTURING COLOR DISPLAY DEVICE COMPRISING THEM, OR COLOR DISPLAY DEVICE

(75) Inventors: Hideki Matsuoka, Moriguchi (JP); Kazuyuki Maeda, Moriguchi (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 11/399,864

(22) Filed: Apr. 7, 2006

(65) Prior Publication Data

US 2006/0191626 A1    Aug. 31, 2006

Related U.S. Application Data

(62) Division of application No. 10/149,689, filed as application No. PCT/JP01/08965 on Oct. 12, 2001, now abandoned.

(30) Foreign Application Priority Data

Oct. 10, 2000 (JP) ............... 2003-11495
Oct. 10, 2000 (JP) ............... 2003-11499

(51) Int. Cl.
- B44C 1/17 (2006.01)
- B32B 37/10 (2006.01)
- B32B 37/14 (2006.01)
- G03F 1/06 (2006.01)
- G02B 5/22 (2006.01)
- B44C 1/24 (2006.01)
- B32B 37/18 (2006.01)

(52) U.S. Cl. .............. 156/245; 156/230; 156/240; 156/247; 156/249; 430/7; 349/106; 359/891

(58) Field of Classification Search ........... 156/230, 156/240, 242, 244.27, 245, 247, 249, 306.3; 359/885–892, 900; 349/106; 430/7

See application file for complete search history.

(56) References Cited

U.S. PATENT DOCUMENTS 1,001,050 A    8/1911    Kolhaas
5,742,129 A    4/1998    Nagayama et al.

(Continued)

OTHER PUBLICATIONS

Japanese Patent application publication No. 2000098367 A with English abstract, Apr. 7, 2000.

(Continued)

*Primary Examiner*—Philip Tucker
*Assistant Examiner*—Sonya Mazumdar
(74) *Attorney, Agent, or Firm*—Cantor Colburn LLP

(57) ABSTRACT

A color filter formation method for transferring a color filter layer provided on a transfer film to a transferred substrate comprises arranging on said transferred substrate a plurality of wirings side by side to extend in a predetermined direction; covering the wirings with a protective insulating layer, wherein the protective insulating layer is formed as a rib protruding from said substrate; affixing said color filter layer on said transfer film onto said transferred substrate through pressure applied by a pressing mechanism; and moving the pressing mechanism in a direction in which said protective insulating layer extends, thereby transferring said color filter layer onto said transferred substrate.

5 Claims, 16 Drawing Sheets

U.S. PATENT DOCUMENTS 5,919,532 A * 7/1999 Sato et al. .................. 428/1.6
6,060,199 A * 5/2000 Nagata et al. ................. 430/7
6,909,477 B1 6/2005 Yi et al.

OTHER PUBLICATIONS

Japanese Patent application publication No. 2000089213 A with English abstract, Mar. 31, 2000.
European Patent application No. EP 0 880 303 AI, Nov. 25, 1997.
Japanese Patent application publication No. 8-227276 with English abstract, Sep. 3, 1996.
International Search Report for PCT application No. PCT/JP01/08965 dated Dec. 18, 2001.
Japanese Patent application publication No. JP10153967 with English abstract, Jun. 9, 1998.
Japanese Patent application publication No. JP1164621 with English abstract, Jun. 28, 1989.
PCT application No. WO98/24271 with English abstract, Jun. 4, 1998.
Chinese application No. CN 1212114 with English abstract for corresponding document No. EP 0880303, Mar. 24, 1999.

* cited by examiner

METHOD FOR FORMING COLOR FILTER, METHOD FOR FORMING LIGHT EMITTING ELEMENT LAYER, METHOD FOR MANUFACTURING COLOR DISPLAY DEVICE COMPRISING THEM, OR COLOR DISPLAY DEVICE

CROSS-REFERENCE TO RELATED APPLICATIONS

This application is a divisional application of U.S. patent application Ser. No. 10/149,689 filed on Jun. 11, 2002, now abandoned which is a national phase application of PCT/JP01/08965 filed on Oct. 12, 2001, which claims priority to Japanese Application Nos. 200311495 and 200311499 that were each filed on Oct. 10, 2000, which are all herein incorporated by reference their entirety.

TECHNICAL FIELD

The present invention relates to a method of forming a color filter, and more particularly to a method of forming a color filter or an emissive element layer on a substrate where a data line, a switching element, a pixel electrode, and the like are formed in devices such as a color liquid crystal display device and a color electroluminescence display device, or to such a display device.

BACKGROUND ART

Flat display devices, such as a liquid crystal display device, are rapidly gaining widespread use as compact and thin display devices. Among such flat display devices, a liquid crystal display device (LCD), for example, is composed of liquid crystal sealed between first and second substrates each having an electrode formed on the side opposite to each other. In a LCD displaying color images, a color filter of R, G, or B is formed corresponding to each pixel, thereby controlling the color displayed by each pixel.

FIG. 1 illustrates a circuit structure of an active matrix type LCD in which the display at each pixel is controlled by a switching element, such as a thin film transistor (TFT) connected to a pixel electrode, provided for each pixel. In such an active type LCD, the TFT and the pixel electrode are formed on the first substrate, and a common electrode is formed on the second substrate provided opposite to the first substrate. While a color filter is formed in a color active matrix LCD in addition to the above-described elements, such a color filter is usually formed on the second substrate where the above-described common electrode is formed in conventional devices.

When the color filter is formed on the second substrate, alignment between the first and second substrates must be taken into consideration, and therefore a black matrix must be formed on the second substrate to compensate for misalignment. However, the black matrix is a major cause of decreasing the aperture ratio of the LCD, and therefore improvement is required in LCDs which particularly demand higher aperture ratio.

In order to eliminate the above-described black matrix and improve the aperture ratio, an LCD of the so-called on-chip color filter configuration in which a color filter is formed on a substrate for forming the switching element (the first substrate) has been proposed. In such an on-chip color filter configuration, the need for providing the black matrix to cope with misalignment in affixing the second substrate to the first substrate can be eliminated.

FIG. 2 shows a configuration of an on-chip color filter in an active matrix LCD. On a first substrate 10, a data line and agate line (not shown in FIG. 2) are formed in a matrix as illustrated in FIG. 1, and a TFT 2 (not shown in FIG. 2) is formed near the intersection of these lines. The gate line and the TFT are first formed on the substrate, and on an insulating film formed to cover these elements the above-described data line 30 and a color filter 50 for each pixel are formed. On the color filter 50, a pixel electrode 20 of indium tin oxide (ITO) or the like is formed connected to the TFT through a contact hole. The first substrate 10 formed as described above is affixed to a second substrate 80 having a common electrode 82 at the surface with a liquid crystal layer 70 interposed between the substrates. By controlling a voltage applied to the liquid crystal layer 70 for each pixel with the common electrode 82 and the pixel electrode 20, liquid crystal is driven and color display is presented. Use of such an on-chip color filter makes achievement of a bright color display possible.

Although color blur can be diminished by using the above-described on-chip color filter, forming a color filter of R, G, or B for a corresponding pixel requires a step of etching each color filter formed on the entire substrate away from the unnecessary pixel position so that the color filter remains only at the necessary pixel position, and this step must be performed for each of the color filters of R, G, and B.

However, formed under such color filters provided on the first substrate are the TFT for supplying a display data voltage to each pixel electrode, and wirings for supplying a display data signal and a scanning signal to the TFT, as described above. Consequently, the underlying wirings and a conductive layer of the TFT are prone to erosion and oxidation when the color filters are patterned.

Especially, the data line and the gate line are often disposed at the boundary between display electrodes. Particularly, the data line is often formed of aluminum (Al) having a high electric conductivity but susceptible to erosion and oxidation as shown in FIG. 2, and is positioned at the boundary between adjoining pixels of the color filters patterned for each pixel as illustrated in FIG. 2. When a color filter material including a negative photoresist material and pigment mixed thereto is used for the on-chip color filter configuration, the color filter can be formed to a desired shape by performing light exposure and development on the color filter. However, the data line is easily degraded by being exposed to alkali developer or the like used for patterning the color filter.

On the other hand, for an LCD with a small pixel, such as an LCD for a view finder, accuracy of patterning of the color filter is important because the color filter must be carefully made not to extend to the adjacent pixels. However, it is difficult to obtain color filters having a sharp outline only through developing and etching techniques because a photosensitive resin or the like is used as a primary material for the color filter and because the filter is relatively thick, making it impossible to prevent the color filter from extending to adjacent pixel regions.

In order to solve the above-described problems, an object of the present invention is to form an on-chip color filter having a sharp outline without adversely affecting underlying wirings and the like.

Another object of the present invention is to provide a method of surely preventing formation of a gap between a color filter and a substrate during transfer without adversely affecting underlying wirings and the like when the on-chip color filter is formed through a transfer method.

DISCLOSURE OF THE INVENTION

In order to achieve the above objects, the present invention has the following characteristics.

According to the present invention, in a method of transferring a color filter layer or an emissive element layer provided on a transfer film to a transferred substrate, the transferred film includes a plurality of wirings arranged side by side to extend in a predetermined direction, and a protective insulating layer covering the wirings and formed as a rib protruding from said substrate, the color filter layer or the emissive element layer on said transfer film is affixed onto said transferred substrate through pressure applied by a pressing mechanism, and the pressing mechanism is moved in a direction in which said protective insulating layer extends, thereby transferring said color filter layer onto said transferred substrate.

According to an aspect of the present invention, a method of manufacturing a color display device is provided. The device comprises, on a substrate, a plurality of switching elements, a data line for supplying a data signal to a corresponding switching element among said plurality of switching elements, a selection line for supplying a selection signal to the corresponding switching element, a pixel electrode directly or indirectly connected to the corresponding switching element, and a color filter formed under said pixel electrode. In the above method, said selection line, said switching element, and said data line are first formed on said substrate, and then a protective insulating layer is formed covering each said data line extending in a column direction and protruding from said substrate as a rib, a color filter layer on a transfer film is affixed onto said substrate through pressure applied by a pressing mechanism, and the pressing mechanism is moved in a direction in which said protective insulating layer extends, thereby transferring said color filter layer onto said substrate.

According to another aspect of the present invention, a method of manufacturing a color display device is provided. The device comprises a plurality of pixels on a substrate, each of said plurality of pixels including an emissive element including an emissive element layer between a first electrode and a second electrode, a switching transistor connected to a data line and a selection line, and an element driving transistor connected between a driving power source and said emissive element for controlling electric power supplied from the driving power source to said emissive element in accordance with a data signal supplied from a data line through said switching transistor. In the method, on said substrate, after said data line extending in a column direction is formed, a protective insulating layer is formed covering said data line and protruding from said substrate as a rib, the emissive element layer on a transfer film is affixed by means of a pressing mechanism onto said first electrode of said emissive element formed on said substrate in a region sandwiched by said protective insulating layers arranged side by side, and said pressing mechanism is moved in a direction in which said protective insulating layer extends, thereby transferring said emissive element layer onto said first electrode.

According to the present invention, wirings such as data lines are covered with a protective insulating layer, so that degradation of the wirings as a result of exposure to the ambient air and a processing solution for color filters can be prevented during formation of, for example, color filters of R, G, and B, and emissive element layers capable of emitting light of these colors on the substrate in succession. The protective insulating layer is formed as a rib covering the wirings in the column direction, whereby each pixel space is formed on the substrate with the protective insulating layer acting as either sidewall in the column direction when the color filter and the like is transferred. According to the present invention, transfer is performed in the direction in which this rib extends (column direction), whereby the color filter and the like can be embedded without gaps between the filter and the substrate while the ambient gas is expelled forward in the column direction from the above-described pixel space.

According to a further aspect of the present invention, a color filter formation method for discharging a liquid color filter material to a transferred substrate, rather than transferring a color filter or an emissive element layer with the above-described pressing mechanism, is provided in which a plurality of wirings are arranged side by side to extend in a predetermined direction, and a protective insulating layer covering the wirings and formed as a rib protruding from said substrate are provided, the liquid color filter material or an emissive element material is discharged from a discharging mechanism, and the discharging mechanism is relatively moved in a direction in which said protective insulating layer extends, thereby forming said color filter layer or the emissive element layer on said transferred substrate.

Thus, when the liquid color filter material or emissive element material is discharged from the discharging mechanism, the protective insulating layer is used as a sidewall and the material is discharged to the pixel space formed by the protective insulating layer, thereby reliably preventing the material from flowing outside the sidewall, i.e. flowing to the pixel space in the adjacent column, even though the liquid material is used. Further, the discharging mechanism is relatively moved in the direction in which the protective insulating layer extends, thereby further reducing the likelihood of attachment of a material for an unintended color, and ensuring formation of the material layer at a corner of the projecting protective insulating layer and the flat substrate surface. In addition, selectively dropping the material of the corresponding color from the discharging mechanism to the corresponding pixel space can be achieved. Such a selective discharge does not cause formation of the material layer in unnecessary regions, thereby eliminating any need for removing such a material layer, and therefore contributing to reduction in material cost.

According to a further aspect of the present invention, in the above-described color display device or the method of manufacturing the same, a color filter block layer is provided between a region for forming a contact hole electrically connecting layers of said pixel electrode and said switching element, and a pixel space provided so that said protective insulating layer acts as a side edge in the column direction.

The color filter block layer is formed, prior to transfer of the color filter, near a region where a contact hole for electrically connecting layers of said pixel electrode and said switching element is formed, and a passage for expelling the ambient gas in the column direction during transfer of the color filter is secured between the color filter block layer and said protective insulating layer.

Because the color filter is relatively thick and often formed of a material hard to remove once formed, the above color filter block layer is effective for providing a structure beforehand in which the color filter material is hard to get into an area near the contact region, during the formation thereof, between the pixel electrode and the switching element, which region significantly affects display quality.

Further, also in a region where the color filter block layer is formed, the color filter can be transferred while expelling the ambient gas in the column direction so that the color filter can be embedded near this region closely contacting the substrate. Further, because the color filter block layer is thus provided, the thick color filter, often formed of a material hard to remove once provided, is not likely to penetrate into the area surrounding the contact region.

According to a further aspect of the present invention, a color display device comprises on a substrate a plurality of switching elements arranged in a matrix, a plurality of data lines extending in a column direction for supplying a data signal to a corresponding switching element among said plurality of switching elements, a plurality of selection lines extending in a row direction for supplying a selection signal to the corresponding switching element, a pixel electrode disposed in a pixel region sectioned by said data line and said selection line for receiving the data signal through said corresponding switching element, and a protective insulating layer formed covering said data line, wherein a color filter of a color assigned to each pixel is further formed in a pixel space provided so that said protective insulating layer acts as either side edge in the column direction.

According to a further aspect of the present invention, a color display device composed of liquid crystal sealed between first and second substrates disposed opposite to each other comprises, on said first substrate, a plurality of switching elements arranged in a matrix, a plurality of data lines extending in a column direction for supplying a data signal to a corresponding switching element among said plurality of switching elements, a plurality of selection lines extending in a row direction for supplying a selection signal to the corresponding switching element, a pixel electrode disposed in a pixel region sectioned by said data line and said selection line for receiving the data signal through said corresponding switching element, and driving liquid crystal between said pixel electrode and an electrode on said second substrate provided opposite thereto, and a protective insulating layer formed covering said data line, wherein a color filter of a color assigned to each pixel is further formed in each pixel space provided so that said protective insulating layer acts as either side edge in the column direction.

According to a further aspect of the present invention, in the above-described color display device, said protective insulating layer has a thickness such that an upper surface thereof is positioned approximately as high as or higher than an upper surface of said color filter.

As described above, according to the present invention, although the color filter is provided near the region for forming the data line, degradation of the data line due to exposure to the ambient air and a processing solution for the color filter when the color filter of the corresponding color, i.e. R, G, or B, is formed in succession for each pixel because the data line is covered with the protective insulating layer.

Because the protective insulating layer covers the data line extending in the column direction, spaces each defined by the protective insulating layer at either side edge are formed in the column direction. By forming the color filter by embedding or dropping the material in this space as described above, mixture of colors at adjoining pixels provided with color filters of different colors can be easily prevented. Especially, by providing the protective insulating layer with a sufficient thickness, a sidewall can be formed by the protective insulating layer in the column direction for each pixel, thereby preventing the color filter of a different color from overriding the protective insulating layer to penetrate into the adjacent pixel region.

Naturally, according to the present invention, the distance between the color filter and the pixel electrode for individually controlling transmitted light is relatively small in, for example, a liquid crystal display device because the color filter is provided on the pixel electrode side, thereby preventing light transmitted through an adjacent pixel from being recognized by a viewer.

According to a further aspect of the present invention, a color display device as described above is an electroluminescence display device comprising an electroluminescence element for each pixel, said pixel electrode is a first electrode of said electroluminescence element, and emissive intensity of said electroluminescence element is controlled in accordance with electric power corresponding to the data signal supplied to said first electrode.

According to a further aspect of the present invention, a plurality of pixels are provided on a substrate, each pixel including an emissive element including an emissive element layer between a first electrode and a second electrode, a switching transistor connected to a data line and a selection line, and an element driving transistor connected between a driving power source and said emissive element for controlling electric power supplied from the driving power source to said emissive element in accordance with a data signal supplied from the data line through said switching transistor, wherein a protective insulating layer is formed covering at least said data line extending in a column direction, and an emissive element layer capable of emitting light of a color assigned to a corresponding pixel among said plurality of pixels is formed in a pixel space provided so that said protective insulating layer acts as either side edge in the column direction.

Thus, according to the present invention, the color filter layer or the emissive element layer in a color display device having an electroluminescence element for each pixel is formed by a transfer method or the so-called ink jet method while the pixel formation regions in the adjoining columns are spaced apart by the protective insulating layer covering the data line as described above, thereby preventing mixture of colors due to mixture of materials at adjoining pixels assigned different colors, so that a color emissive display device with high color purity and excellent color reproducibility can be achieved.

According to a further aspect of the present invention, in the color display device having the above-described electroluminescence element for each pixel, said protective insulating layer has a thickness such that an upper surface thereof is positioned approximately as high as, or lower than, an upper surface of said emissive element layer.

Because the second electrode of the electroluminescence element common to the plurality of pixels, for example, is formed on the emissive element layer, the surface on which the second electrode is formed can be made as flat as possible by satisfying the above-described relationship with respect to the thickness of the protective insulating layer. Further, because the resistance of the emissive element layer is often relatively high, problems, such as short-circuiting, can be avoided even when the protective insulating layer is somewhat small in height.

According to a further aspect of the present invention, a color display device is provided wherein a plurality of pixel regions are formed in a matrix on a substrate, in each pixel region at least a switching element connected to a data line and a selection line, and a pixel electrode receiving directly or indirectly a data signal through said switching element are disposed, and a color filter of an assigned color is formed in a pixel space provided so that a rib-shaped insulating layer formed to extend on a boundary between adjoining pixel regions assigned colors different from each other acts as either sidewall in a column direction.

According to a further aspect of the present invention, a color display device comprising a plurality of pixels on a substrate is provided in which each pixel includes an emissive element including an emissive element layer between a first electrode and a second electrode, a switching transistor connected to a data line and a selection line, and an element driving transistor connected between a driving power source and said emissive element for controlling electric power supplied from the driving power source to said emissive element in accordance with a data signal supplied from the data line through said switching transistor, wherein an emissive element layer capable of emitting light of an assigned color is formed in each pixel space provided so that a rib-shaped insulating layer formed to extend on a boundary between adjoining pixel regions assigned colors different from each other acts as either sidewall in a column direction.

As described above, the color filter or the emissive element layer can also be easily formed without mixing different colors by employing a configuration wherein the rib-shaped insulating layer is disposed to extend on the boundary between adjoining pixels (pixel regions) assigned different colors and the color filter or the emissive element layer with the assigned color is formed in a pixel space formed with the rib-shaped insulating layer as either sidewall in the column direction. The color filter or the emissive element layer can be formed by the above-described transfer or discharging method or the like, and either method can simply and reliably prevent mixing of materials for different colors.

BEST MODE FOR CARRYING OUT THE INVENTION

Preferred embodiments of the present invention will next be described with reference to the accompanying drawings.

First Embodiment

In a first embodiment, a transfer method in which a color filter layer provided on a transfer film is transferred to a transferred substrate is employed as a method of forming a color filter layer used in a color display device and the like. Further, in the present embodiment, a plurality of wirings are arranged side by side to extend in a predetermined direction, and a protective insulating layer covering such wirings and protruding from the substrate in the shape of a rib are formed on the transferred substrate prior to transfer. As a pressing mechanism for such a transferred substrate, a transfer roller, for example, is used for attaching the color filter layer formed on the roller transfer film through pressure, and the roller is moved in a direction in which the protective insulating layer extends, thereby accurately transferring the color filter layer to a pixel region sectioned by the protective insulating layer.

The transferred substrate may be, for example, a first substrate of the liquid crystal display device, or an element substrate in an electroluminescence display device. On the substrate are formed a color filter, a plurality of switching elements (such as TFTs), a plurality of data lines for supplying a data signal to the TFTs, a plurality of gate lines for supplying a selection signal to the corresponding TFT switching element, a pixel electrode connected to the TFT, and the like.

Figure 1:
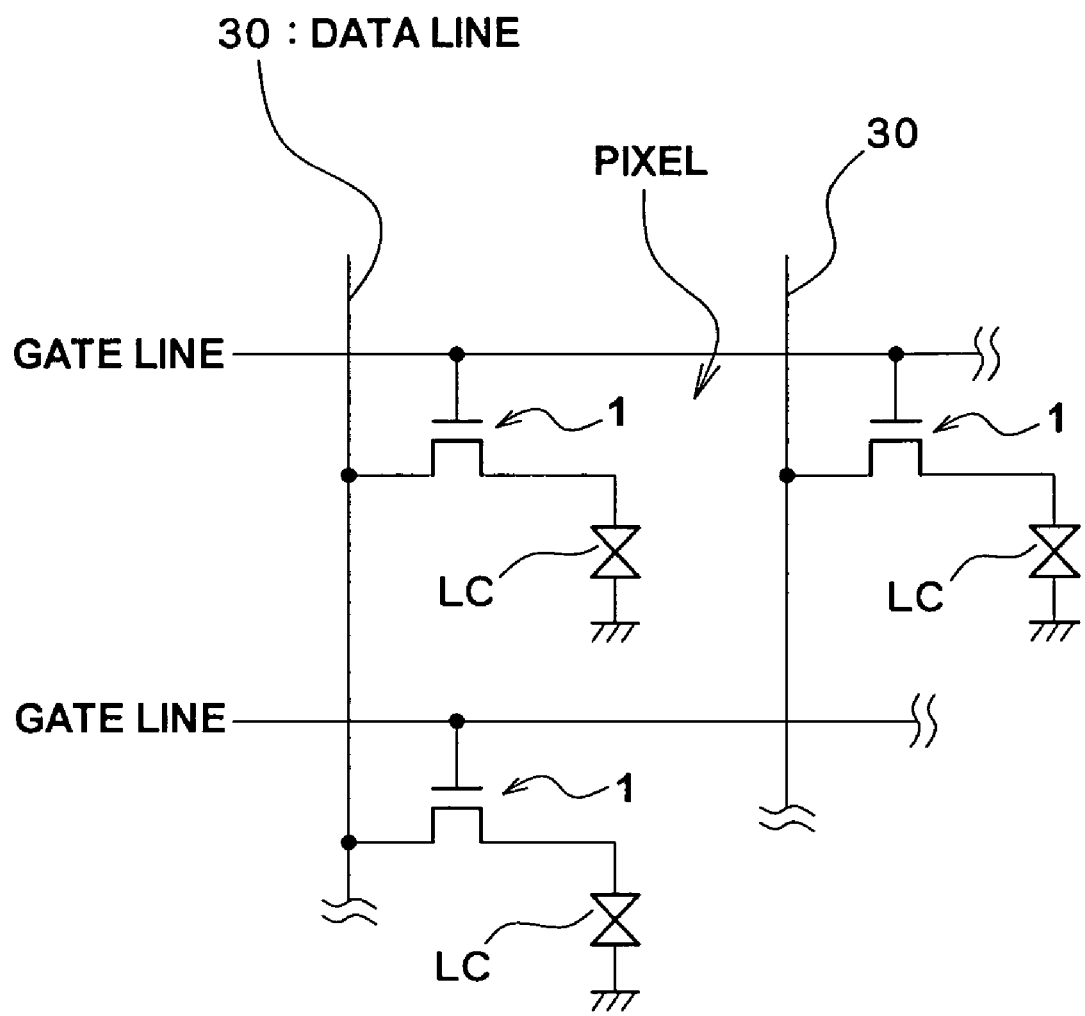
FIG. 1 illustrates a general circuit structure of a liquid crystal display device.
Figure 2:
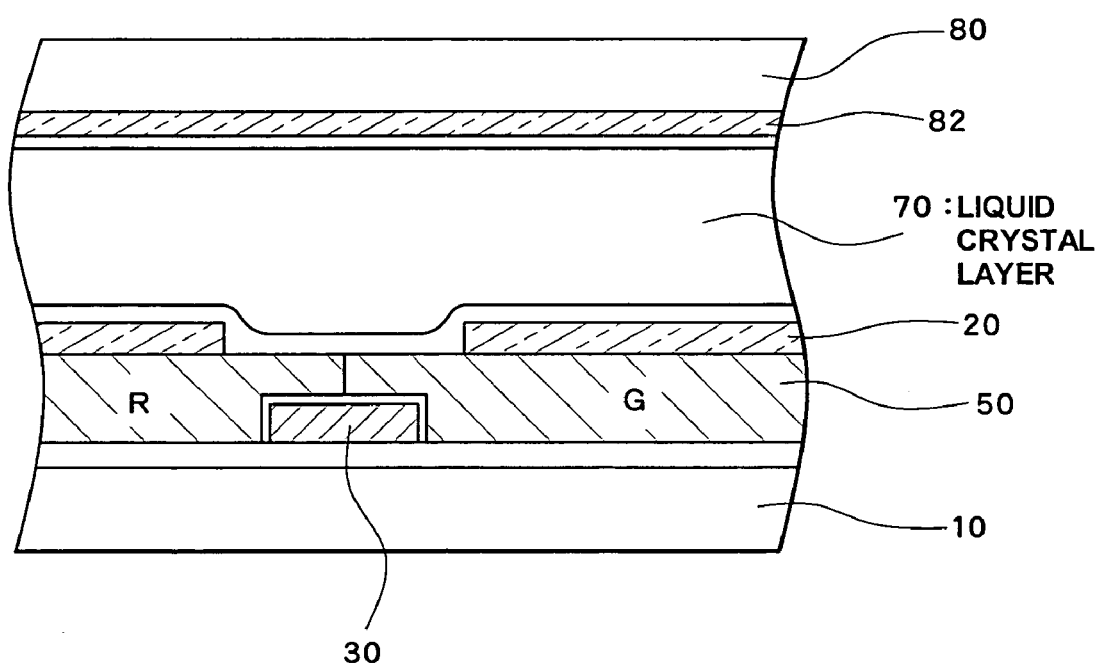
FIG. 2 illustrates a structure of a conventional on-chip color filter.
Figure 3:
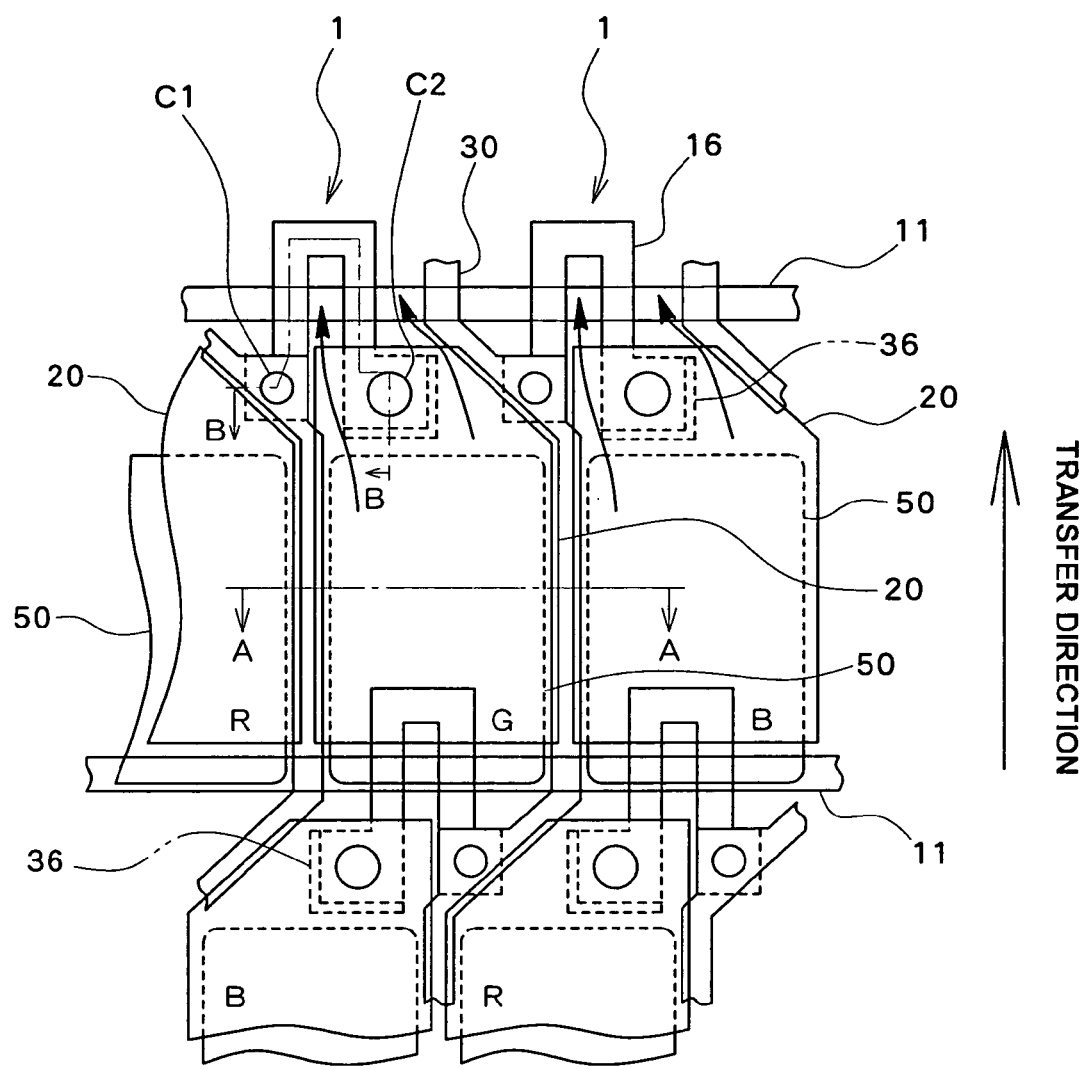
FIG. 3 illustrates a planar structure of a color liquid crystal display device on a first substrate side according to a first embodiment of the present invention.
Figure 4:
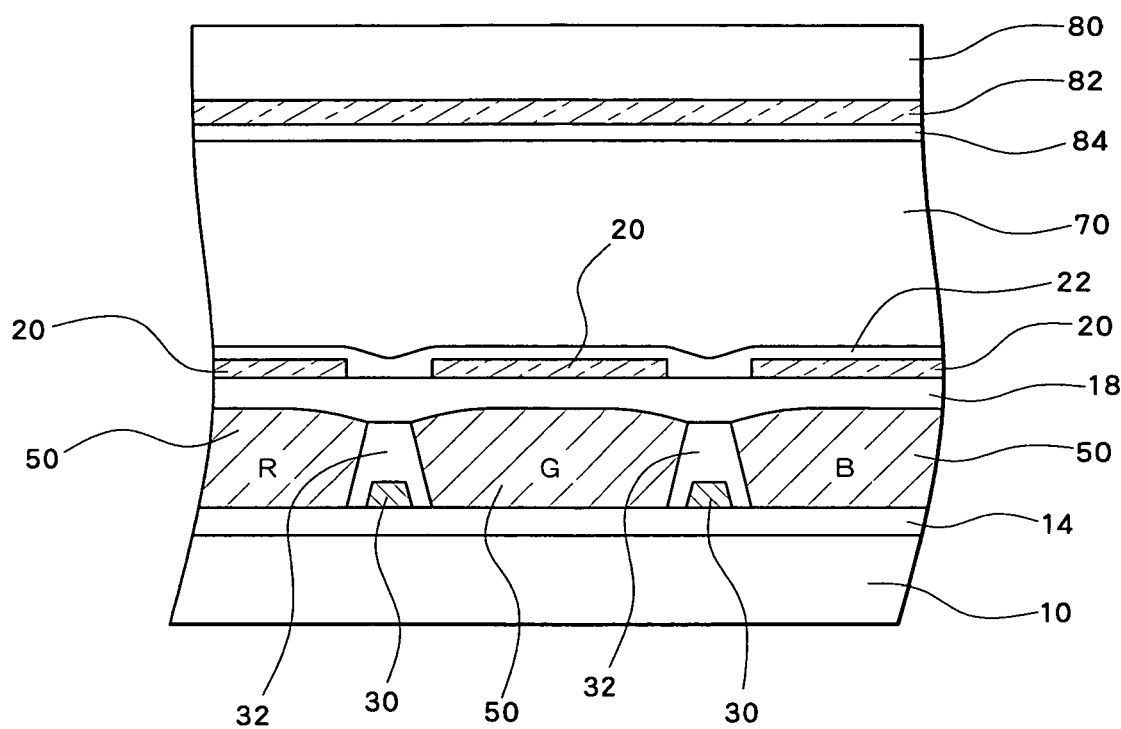
FIG. 4 schematically illustrates a cross sectional structure taken along a line A-A in FIG. 3.

A color LCD provided with an on-chip color filter according to the first embodiment will next be described with reference to the drawings. FIG. 3 illustrates a planar structure of the color LCD according to the first embodiment, FIG. 4 illustrates a cross sectional structure taken along the line A-A in FIG. 3, and FIG. 5 illustrates a cross sectional structure near the TFT taken along the line B-B in FIG. 3.

Referring to FIG. 3, a gate line 11 and a data line 30 are formed in the row and column directions, respectively, on a first substrate 10, and a TFT 1 is formed near each intersection of these lines. The TFT 1 includes a gate electrode 11, and an active layer 16 having two conductive regions (source and drain regions) and a channel region and formed of a polycrystallized silicon (p-Si) layer and the like obtained through laser annealing or the like.

Figure 5:
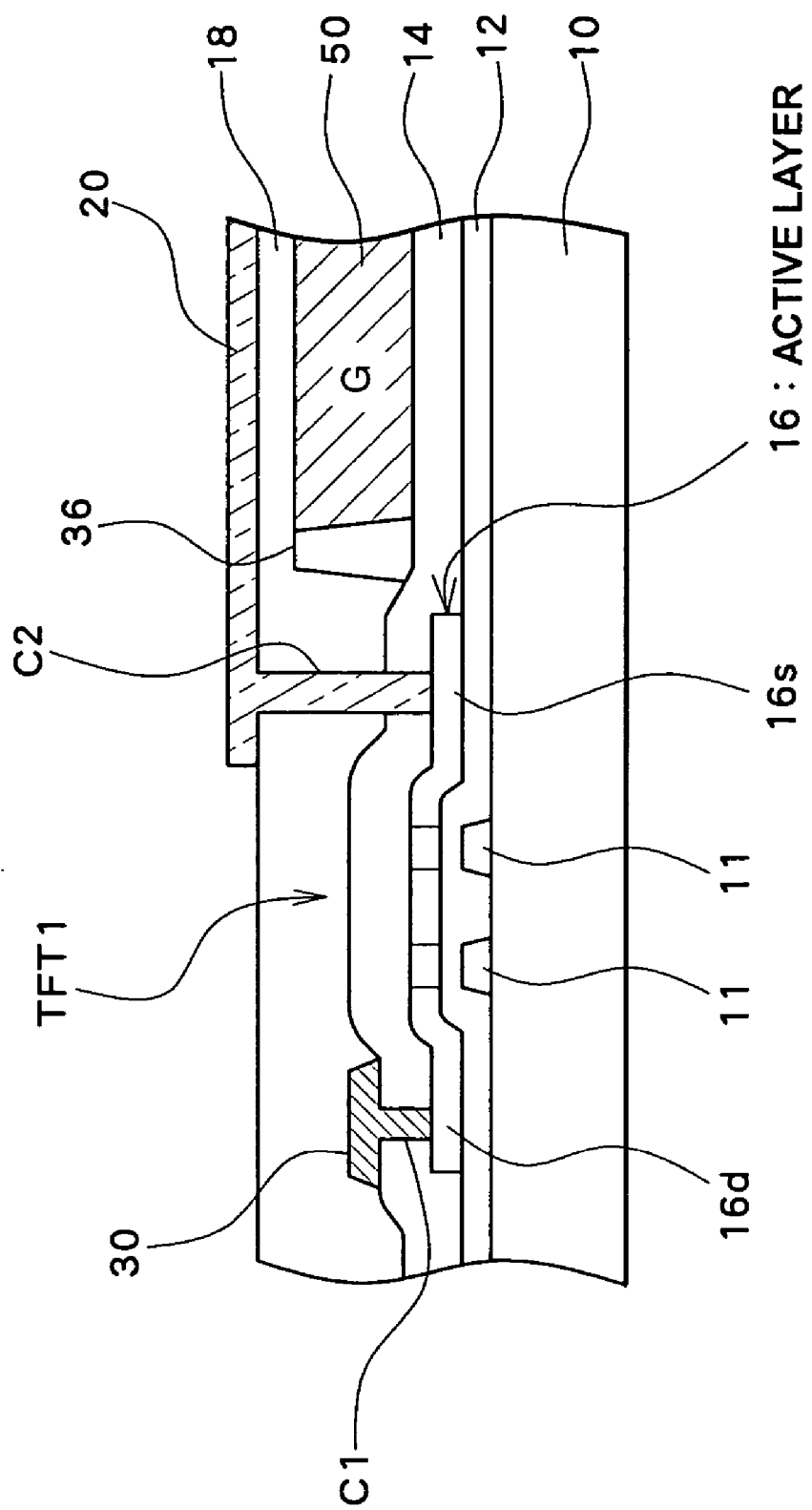
FIG. 5 schematically illustrates a cross sectional structure taken along a line B-B in FIG. 3.

It should be noted that the gate electrode 11 is formed in a layer located below the TFT active layer 16, as illustrated in FIG. 5, and that therefore the TFT 1 is formed as a bottom gate type TFT. Further, in this embodiment, the active layer 16 is formed as a pattern traversing the gate line 11 extending straight in the row direction, and the portion of the gate line 11 overlapping the active layer 16 acts as the gate electrode for each TFT 1, so that the gate line 11 also serves as the gate electrode.

Over the entire surface of the substrate covering the gate line (gate electrode) 11, a gate insulating film 12 is formed on which the active layer 16 having the above-described pattern as illustrated in FIG. 3 is formed, and an interlayer insulating film 14 is formed on the active layer 16 covering the entire substrate.

Referring to FIG. 5, a drain region 16d of the active layer 16 is connected to the data line 30 formed on the interlayer insulating film 14 through a contact hole C1 penetrating through the interlayer insulating film 14. A source region 16s is connected to a pixel electrode 20 formed on a planarization insulating film 18 through a contact hole C2 penetrating through the interlayer insulating film 14 and the planarization insulating film 18.

The plurality of data lines 30 are formed of a material with a high electric conductivity, such as aluminum (Al), and arranged side by side in the column direction on the substrate. As described above, the data lines 30 are connected to the underlying drain region 16d of the TFT 1 through the contact hole C2. In the present embodiment, the so-called delta arrangement is employed in which the pixels of the same color are located shifted for each row as illustrated in FIG. 3 in order to achieve high definition color display. Therefore, the data line 30 extends through the gaps between the pixels located shifted for each row, rather than extending straight in the column direction. Of course, the present invention is not limited to the delta arrangement, and a stripe arrangement where the pixels of the same color are arranged without being shifted in the column direction is also possible. In this arrangement, the data line 30 extends straight in the column direction between pixels.

In the first embodiment, the data line 30 is covered with a thick protective insulating layer 32 acting as a barrier separating adjoining pixels provided with color filters of different colors, or as a sidewall of the region where the color filter is formed for each pixel. In other words, the protective insulating layer 32 divides pixel regions adjoining in the column direction and assigned different colors.

The protective insulating layer 32 also protects the data line 30 from the ambient air and processing solutions (such as alkali developer for a photosensitive color filter) used for the step of forming a color filter in each pixel region, thereby preventing short circuits and discontinuity in the data line. In order to function as a sidewall for forming a color filter, the protective insulating layer 32 preferably has a thickness (height) such that its upper surface is approximately flush with that of a color filter 50, as illustrated in FIG. 4. By way of example, when the data line 30 has a thickness of 0.5 μm and the color filters of R, G, and B are 1.5 μm-2 μm in thickness, the protective insulating layer 32 preferably has a thickness of approximately 1 μm or greater. In order to form an insulating film as thick as approximately 1 μm, the film is preferably of a material resistant to the above-mentioned alkali developer and formed of an insulating material suitable for forming a thick film, such as a photocuring acrylic resin. It should be noted that the protective insulating layer 32 is formed by providing the above-described acrylic resin layer or the like over the entire substrate surface and selectively removing the layer so that the resulting layer 32 is in the form of a rib covering the data line as illustrated in FIG. 4.

Figure 6:
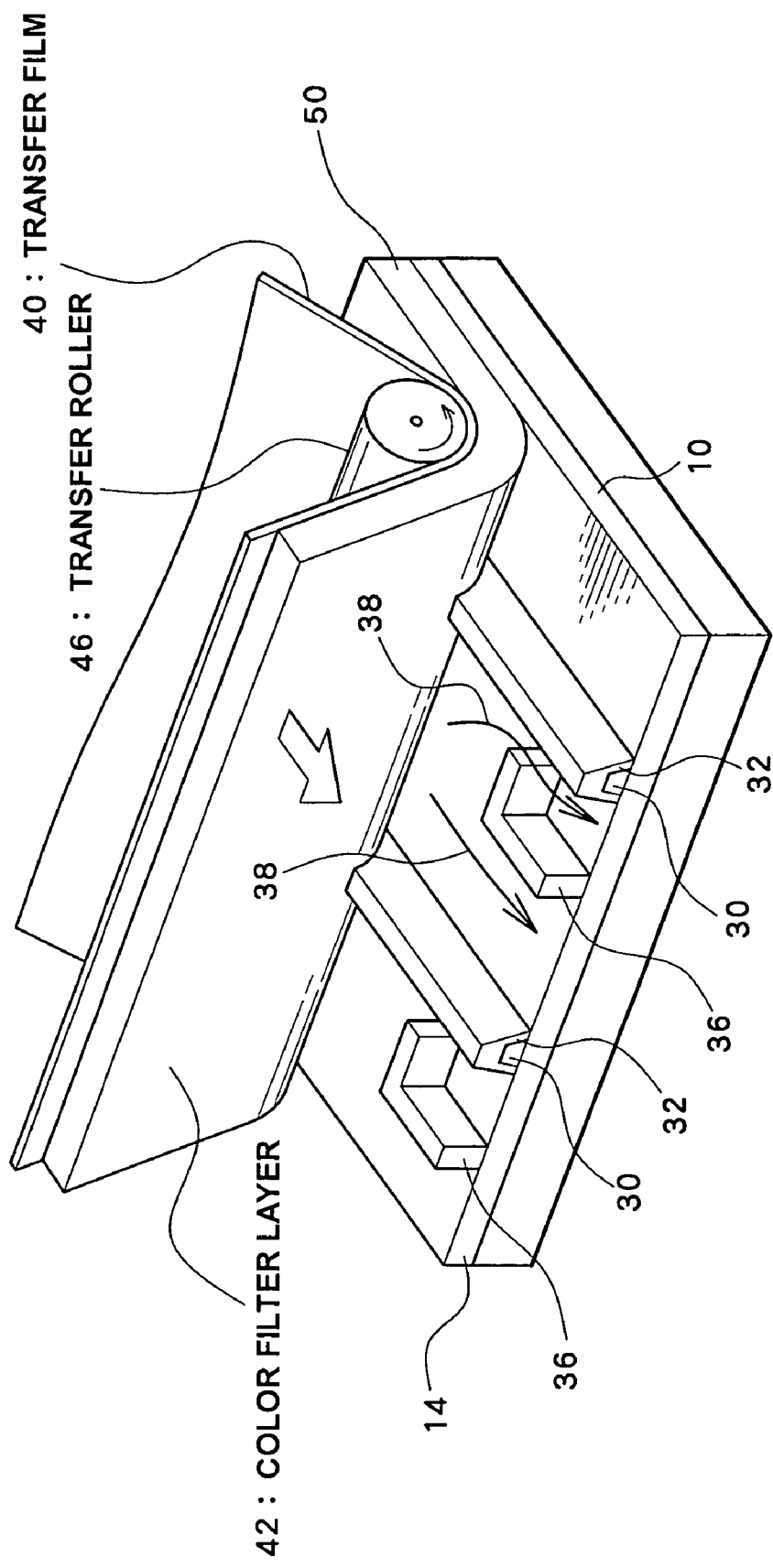
FIG. 6 is a view for explaining a method of forming a color filter according to the first embodiment of the present invention.

After forming the protective insulating layer 32, a color filter is formed. FIG. 6 illustrates a method of transferring the color filter according to the present embodiment.

On the first substrate 10 serving as the transferred substrate during transfer of the color filter, the gate line (gate electrode) 11, the TFT 1, the data line 30, and the protective insulating layer 32 are formed. The protective insulating layer 32 covers the data line 30 and extends in the column direction in the form of a rib as described above, thereby creating each pixel space between the adjoining protective insulating layers 32.

A color filter layer 42 formed on the surface is disposed so as to abut the above-described transferred substrate, and affixed to the first substrate 10 through pressure applied by a transfer roller 46 provided on top of a transfer film 40. While maintaining such a state where the layer is affixed through pressure, the transfer roller 46 is moved in the direction in which the protective insulating layer 32 (data line 30) extends. By thus moving the transfer roller along the direction in which the protective insulating layer 32 extends, the color filter layer 42 is transferred while expelling the ambient gas from the pixel space in the traveling direction.

Figure 7:
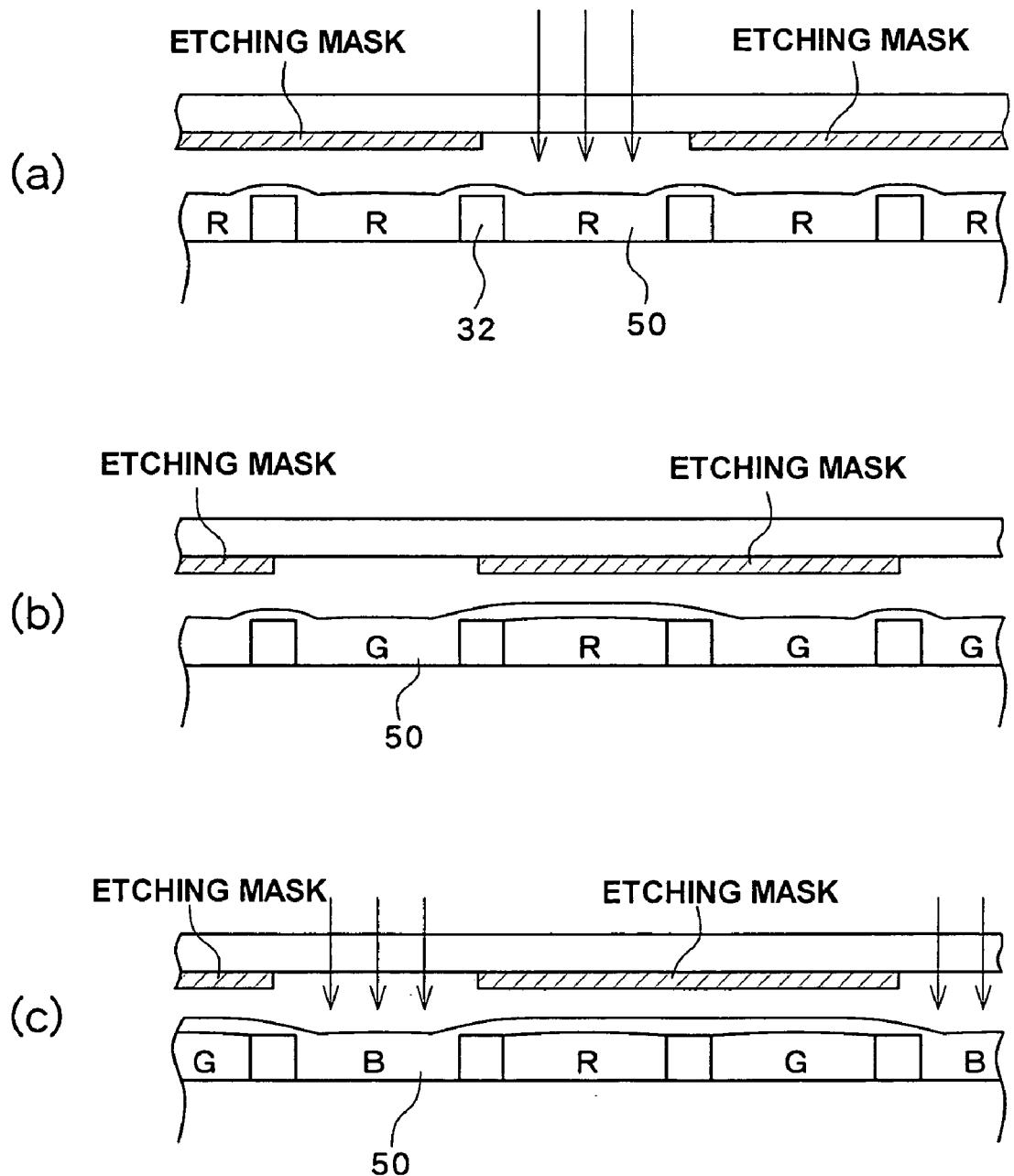
FIG. 7 is a view for explaining the steps of forming the color filter according to the first embodiment of the present invention.

Forming the color filters of R, G, and B for the corresponding pixels requires successive formation of the color filters for the respective colors on the substrate. FIG. 7 illustrates the concept of an example of patterning of the color filters formed in the order of R, G, and B for the corresponding pixel. The color filter is formed of a material including a negative photoresist material and a pigment mixed therein. When such a material is used, the color filter material is removed from the unnecessary position by performing light exposure and development on the filter material.

After the color filter of R is transferred to the entire substrate surface as illustrated in FIG. 7(a) by performing transfer in the column direction as described with reference to FIG. 6, a mask substrate provided with an exposure mask of Cr or the like having an opening only at the position where an R pixel will be formed is disposed over the transferred color filter, and the substrate is exposed to light. By performing development after light exposure, the R color filter 50 embedded at the unexposed pixel spaces for G and B is removed, leaving material only at the pixel space for R. Similarly to the R color filter, a color filter of, for example, G is transferred to the entire surface of the substrate 10, as illustrated in FIG. 6. As the R color filter 50 is already removed from the other pixel spaces than the R pixel space, the G color filter 50G is embedded in the spaces for G and B pixels having the protective insulating layer as a sidewall.

After the transfer, light exposure and development are performed using an exposure mask having an opening only at the G pixel position, the color filter 50G transferred to the pixel spaces other than the G pixel is removed. Finally, the B color filter 50 is transferred to the entire substrate surface, and light exposure and development steps are performed as illustrated in FIG. 7(c), whereby the color filter 50B is embedded in the remaining B pixel space.

After such transfer, an etching step is performed leaving resist at the positions for R and G pixels, thereby removing the color filter 50G embedded in the B pixel space. The B color filter 50B is finally transferred to the entire substrate surface as illustrated in FIG. 6, whereby the color filter 50B is embedded in the remaining B pixel space.

As can be understood from the above description, at least three development (etching) processes are performed when the color filters of R, G, and B are used in order to form the color filters at the corresponding pixel positions of the first substrate. Because the data line is formed at the boundary between the adjoining pixels in the column direction, it is very likely that the data line located at such a position will be exposed to the developer and to ambient air during the above-described step of forming the color filter.

However, according to the present embodiment, the data line 30 is covered with the protective insulating layer 32 having a sufficient resistance, thereby ensuring protection of the data line 30 from erosion, oxidation, and the like from exposure to chemicals in liquid form. Further, provision of the sufficiently thick protective insulating layer 32 approximately flush with the upper surface of the color filter 50 as illustrated in FIG. 4 makes it easy to embed the color filters of R, G, and B separately to the respective pixel regions during the transfer step, to thereby prevent mixture in adjoining pixels of color filters of different colors. While the rib-shaped protective insulating layer 32 protrudes high from the substrate at the step of forming the color filter, transfer of the color filter can be achieved while expelling the ambient gas because the transfer is performed in the direction where the protective insulating layer 32 extends, so that the thick color filter 50 can be formed on the first substrate with excellent adhesion.

After the color filter 50 is formed at each pixel position for R, G, and B in the above-described manner, the planarization insulating layer 18 is formed over the entire substrate surface to planarize the upper surface. The pixel electrode 20 is formed of a transparent conductive material, such as ITO, at each pixel position on the planarization insulating film 18. The pixel electrode 20 is connected to the source region 16s of the corresponding TFT 1 through the contact hole C2 provided penetrating the planarization insulating film 18 and the interlayer insulating film 14 as illustrated in FIG. 5, and receives the data signal supplied from the data line 30 through the TFT 1.

On the entire substrate surface covering the pixel electrode 20, an alignment film 22 for controlling the initial alignment of liquid crystal is formed. The first substrate 10 provided with all of the above-described elements is bonded to the second substrate 80 with a predetermined gap between them, and the liquid crystal layer 70 is sealed in the gap formed between the first and second substrates, thereby providing a color LCD cell. On the side of the second substrate 80 facing the first substrate 10, a common electrode 82 of ITO or the like, and an alignment film 84 are formed. The alignment films 22 and 84 on the first and second substrates 10 and 80 are rubbingless films, or rubbed films.

A color filter block layer 36 will next be described. As illustrated in FIG. 5, the contact hole C2 for connecting the pixel electrode 20 and the TFT active layer 16 has a large aspect ratio because it penetrates through both the planarization insulating film 18 and the interlayer insulating film 14, and poor contact significantly affects poor display. On the other hand, the color filter is thick and hard to remove once provided. Therefore, in this embodiment, the color filter block layer 36 is provided near the region for forming the contact hole C2 prior to the step of transferring the color filter, thereby realizing a structure in which the color filter material is hard to get into the region near the contact hole C2 during color filter transfer.

The color filter block layer 36 is formed to have a sufficient thickness (to a level near the height of the upper surface of the color filter) near the contact hole C2. The color filter block layer 36 is also disposed spaced apart from the protective insulating layer 32 to secure a passage 38 for the ambient gas expelled forward during transfer between the layer 36 and the protective insulating layer 32 acting as a sidewall. The block layer 36 may be formed, for example, in the L-shaped pattern as illustrated in FIG. 6, and the side of the L-shaped pattern extending in the row direction is spaced apart from the protective insulating layer 32. The passage 38 for expelling the ambient gas during transfer can thus be secured in the portion separating these elements. In order to prevent the color filter from penetrating into the region for forming the contact hole C2, the side of the L-shaped patterned block layer 36 extending in the column direction is preferably disposed to extend in the direction of transfer from the side of the L shape in the row direction. The block layer 36 is not limited to the illustrated L-shaped pattern, but may be in a U-shaped pattern surrounding the contact hole C2 on three sides, or in a circular pattern surrounding the hole on all sides and having a central opening, as long as the passage 38 is secured in the column direction. Alternatively, a straight pattern extending in the row direction may also be employed, although with such a configuration the effect is diminished.

The block layer 36 can be formed to have a sufficient thickness while minimizing the increase in processing steps by forming the layer 36 of the same material at the same time as the protective insulating layer 32 forming a rib in the column direction. The block layer 36 need not always be provided, and may be omitted as required.

While in the above description the active layer 16 of the above-described TFT 1 is provided over the gate line 11 extending in a straight line at two locations as illustrated in FIG. 3 and of the double gate structure in the electrical sense, the shape of the TFT 1 is not limited to that illustrated in FIG. 3, and may be of a single gate type rather than the double gate type. Further, while a bottom gate TFT in which the gate electrode is provided beneath the active layer is illustrated as an example in FIG. 5, the top gate TFT in which the gate electrode is provided over the active layer will not bring any change in the manner of transferring the color filter.

Second Embodiment

Figure 8:
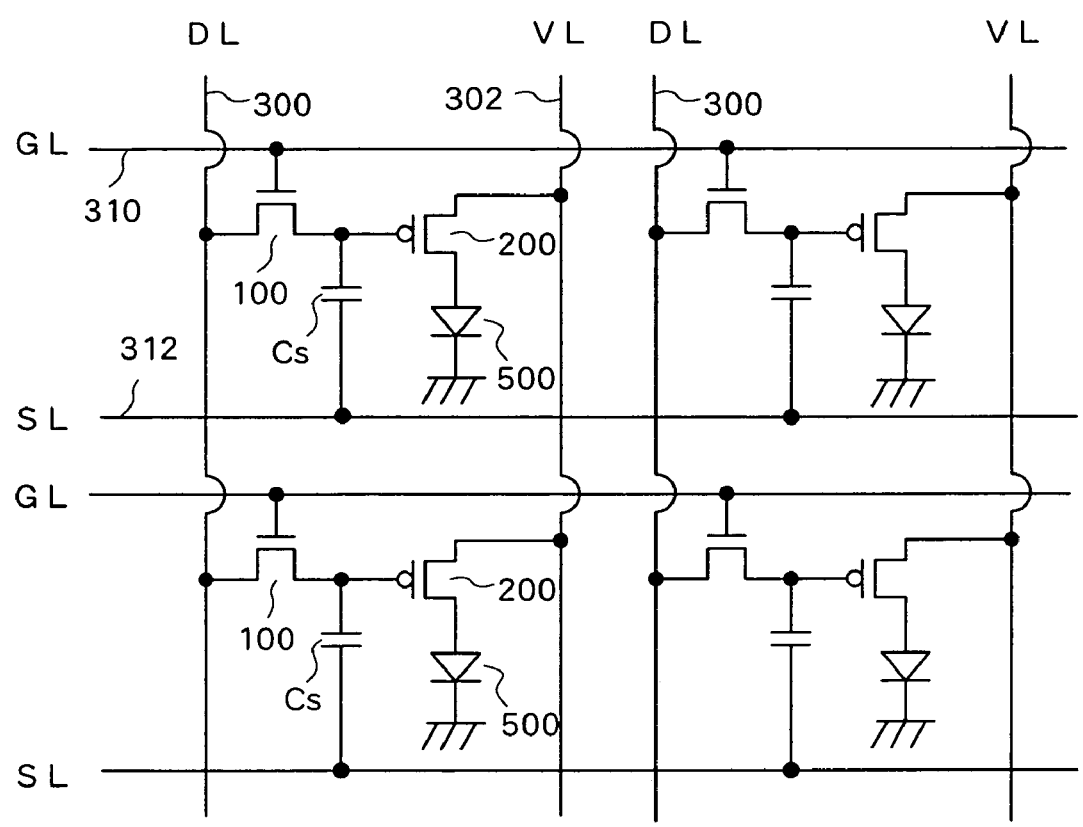
FIG. 8 illustrates an equivalent circuit diagram of each pixel in an organic EL display device of the active matrix type according to a second embodiment of the present invention.

While a color liquid crystal display device has been described as an example in the above first embodiment, in a second embodiment of the present invention, an on-chip color filter layer similar to that in the first embodiment is employed in a color EL display device in which an organic EL element and the like is used for each pixel as a display element. Description thereof will next be made with reference to the drawings. Portions which correspond to those already described are labeled with the same numerals and characters and will be described only briefly. FIG. 8 illustrates an equivalent circuit structure of each pixel in the so-called active matrix organic EL display device having a switching element for each pixel for individually controlling an organic EL element 500.

As illustrated in FIG. 8, each pixel of the organic EL display device includes, for example, the organic EL element 500, a first TFT (switching thin film transistor) 100, a second TFT (element driving thin film transistor), and a storage capacitor Cs. The first TFT 100 has a gate connected to a gate line (GL) 310 extending in the row direction, and, when the transistor is an n-channel TFT, a drain connected to a data line (DL) 300 receiving a data signal and a source connected to a first electrode of the storage capacitor Cs and a gate of the second TFT 200. The storage capacitor Cs is formed of the first and second electrodes facing each other with a gate insulating film interposed between them, as described hereinafter. The second electrode is connected to a common capacitor line (SL) 312.

When the second TFT 200 is a p-channel TFT, a source thereof is connected to a driving power source line (VL) 302 wired from a common driving power source Pvdd, and a drain thereof is connected to an anode of the organic EL element 500 of a diode structure. The gate of the second TFT 200 receives a voltage, applied from the data line 300 when the first TFT 100 is turned on by a selection signal, in accordance with a data signal held by the storage capacitor Cs. The second TFT 200 supplies a current in accordance with a gate voltage to the anode of the organic EL element 500 from the driving power source line 302, and the organic EL element 500 emits light at an intensity in accordance with the supplied current.

Figure 9:
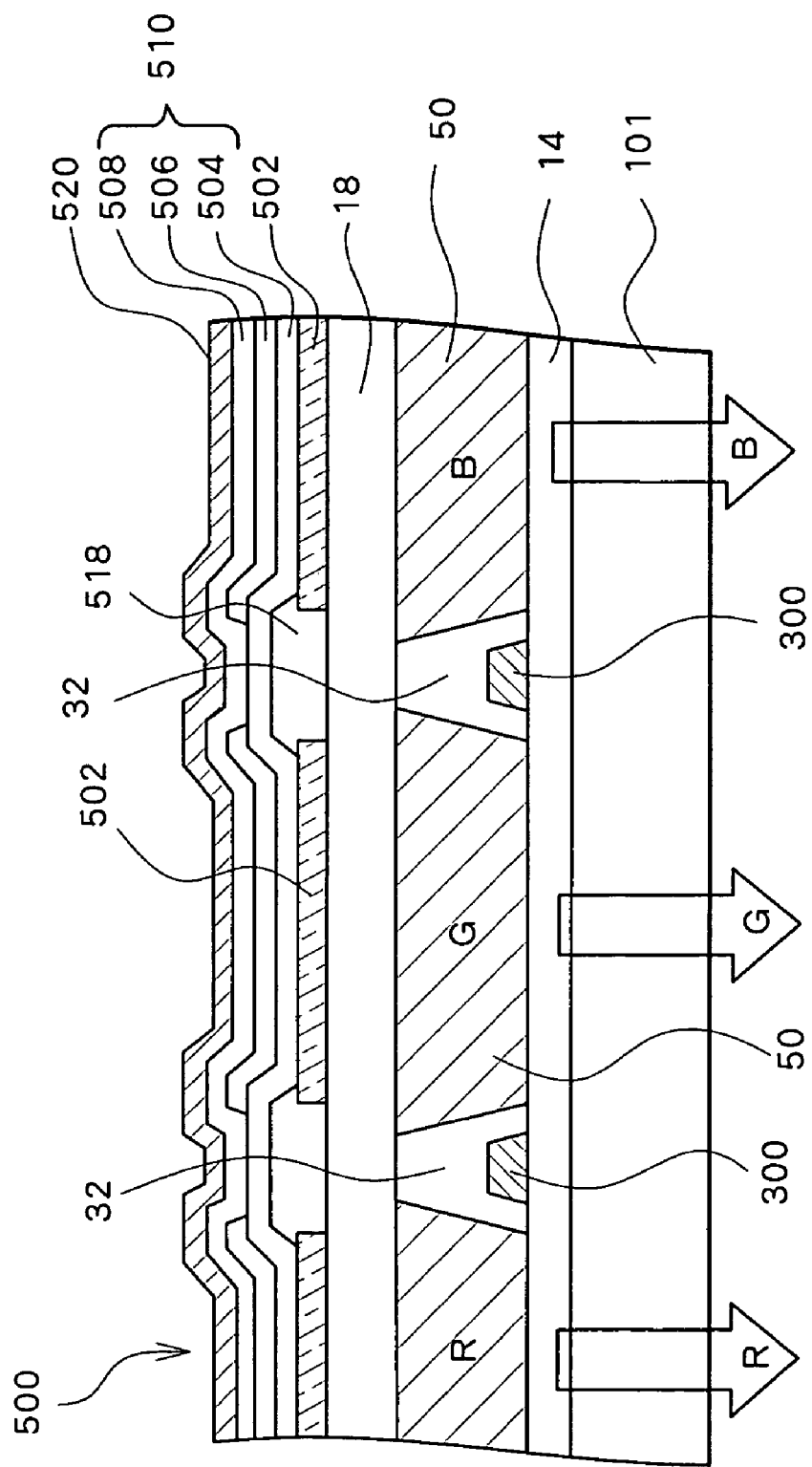
FIG. 9 schematically illustrates a cross sectional structure of the color organic EL display device according to the second embodiment of the present invention.
Figure 10:
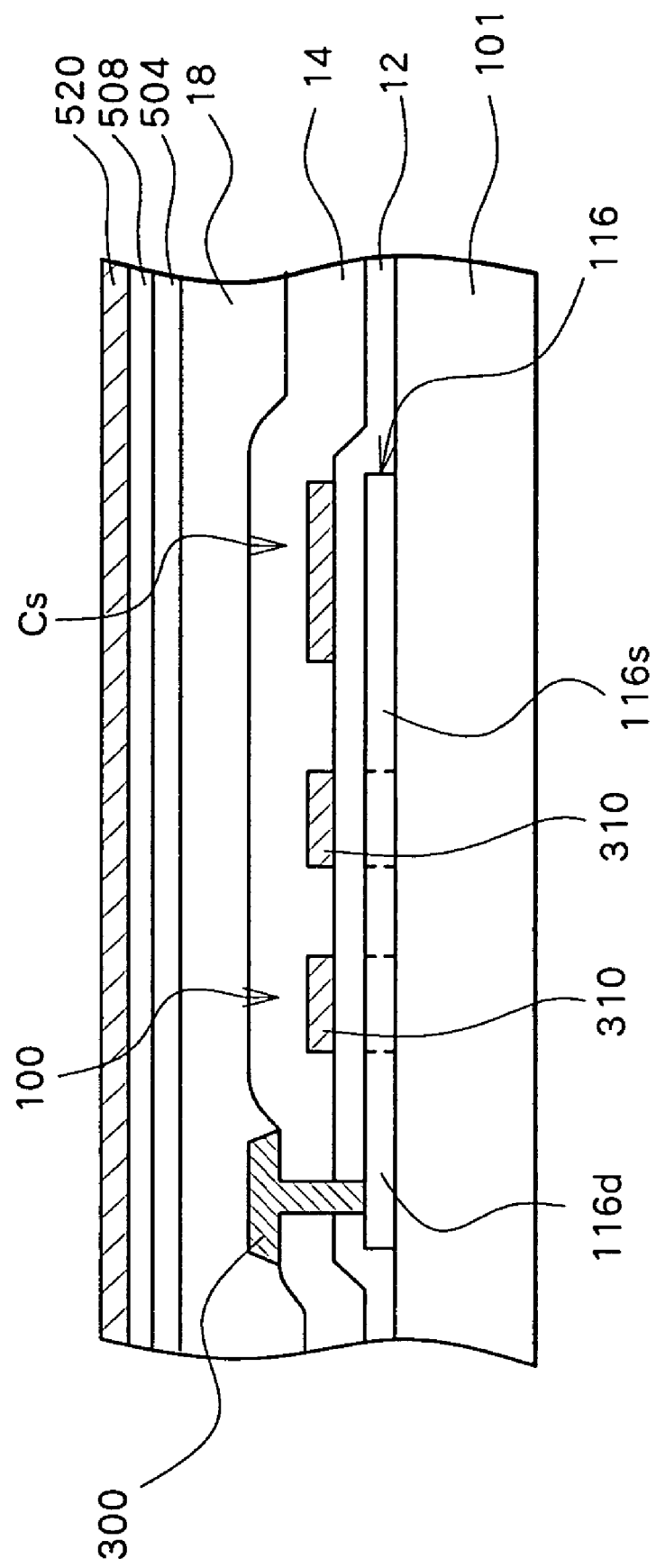
FIG. 10 schematically illustrates a cross sectional structure of a first TFT 100 and a storage capacitor Cs, which are the components for each pixel of the color organic EL display device according to the second embodiment of the present invention.
Figure 11:
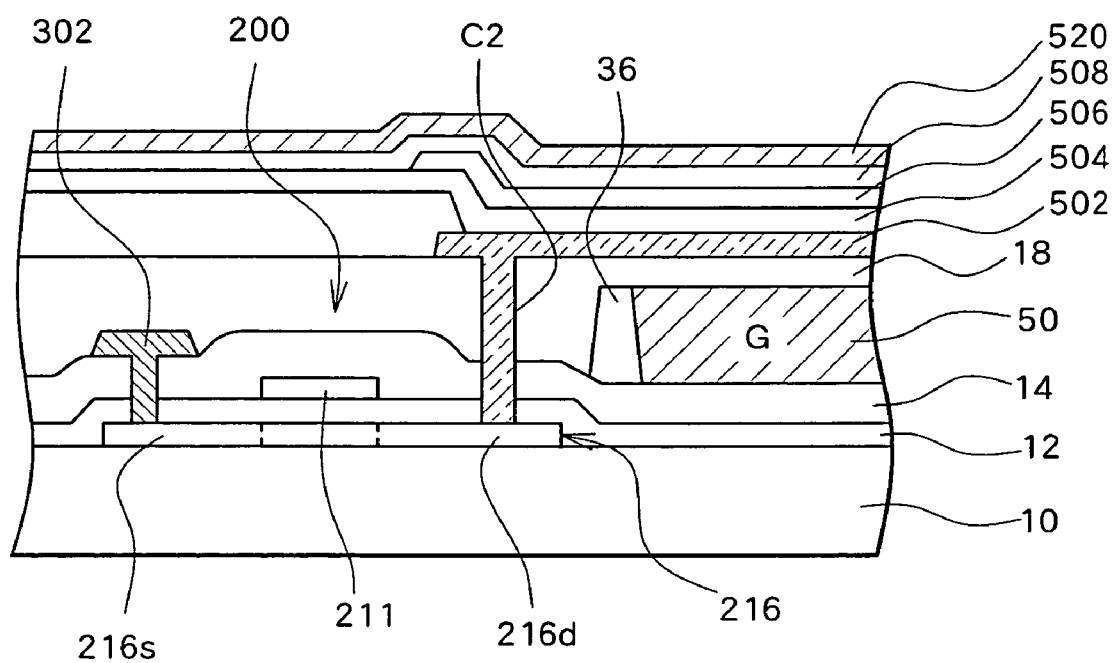
FIG. 11 schematically illustrates a cross sectional structure of a second TFT 200 and an organic EL element, which are the components for each pixel of the color organic EL display device according to the second embodiment of the present invention.

FIG. 9 schematically illustrates a cross sectional structure of each pixel of the color organic EL display device according to the second embodiment. FIGS. 10 and 11 schematically illustrate a cross sectional structure of the above first TFT 100, and the above second TFT 200 and the organic EL element 500, respectively. Both of the first and second TFTs 100 and 200 are of the top gate structure in this example. The active layers 116 and 216 of the respective TFTs are both formed of a polycrystalline silicon layer simultaneously obtained by polycrystallizing an amorphous silicon layer formed on a transparent substrate 101 of glass or the like through laser annealing.

First, in the first TFT 100, a gate insulating film 12 is formed on the active layer 116 as illustrated in FIG. 10, and a gate electrode 310 integral with the gate line (GL) is formed on the gate insulating film 12. The first TFT 100 illustrated in FIG. 10 is of the double gate structure. The region of the active layer 116 located directly under the gate electrode 310 is a channel region, on both sides of which are formed a drain region 116d and a source region 116s having impurities doped thereto. The source region 116s of the first TFT 100 also serves as the first electrode of the storage capacitor Cs, whose second electrode is formed of the same material at the same time as the gate electrode 310 on the gate insulating film 12. The interlayer insulating film 14 is formed on the gate electrode 310, the second electrode of the storage capacitor Cs, and the gate insulating film 12. The data line (DL) 300 also serving as a drain electrode is connected to the drain region 116d of the first TFT 100 through a contact hole formed penetrating the interlayer insulating film 14 and the gate insulating film 12. The planarization insulating film 18 is formed over the entire substrate surface covering the above-described elements.

In the second TFT 200, a gate electrode 211 is formed on the gate insulating film 12 similarly as in the first TFT 100 as illustrated in FIG. 11, and is electrically connected to the first electrode of the above-described storage capacitor Cs. In the second TFT 200, a source electrode, for example, integral with the driving power source line (VL) 302 is connected to a source region 216s of the active layer 216 through the contact hole formed penetrating the interlayer insulating film 14 and the gate insulating film 12. Through the contact hole C2 penetrating the planarization insulating film 18 formed to cover the above elements, the interlayer insulating film 14, and the gate insulating film 12, an anode 502 of the organic EL element 500 formed of ITO or the like and a drain region 216d of the active layer 216 are connected.

The organic EL element 500 includes the anode 502, an emissive element layer 510, and a cathode 520. The anode 502 is formed separately for each pixel as illustrated in FIG. 9, while the cathode 520 made of a metal, such as Al, is formed in common to the respective pixels. The emissive element layer 510 includes an organic material as a main component, and at least includes an emissive layer 506 having an organic emissive material. By way of example, in the illustrated element a hole transportation layer 504, the emissive layer 506, and an electron transport layer 508 are formed in that order on the anode 502. In this second embodiment, of the emissive element layer 510, only the emissive layer 506 is patterned individually for each pixel similarly to the anode 502. The material of the respective layers of the organic EL element 500 is not particularly limited in the second embodiment, and conventionally known materials, such as small molecular organic materials or macromolecular organic materials, and new materials with similar functions may be used to form these layers. By way of example, the respective layers of the emissive element layer 510 described here are formed of a small molecular organic material through a vacuum evaporation or printing method. When macromolecular organic materials are used, the emissive element layer 510 can be formed by, for example, an ink jet method as described hereinafter, but the formation method of the layer 510 is not limited to those described herein.

Figure 12:
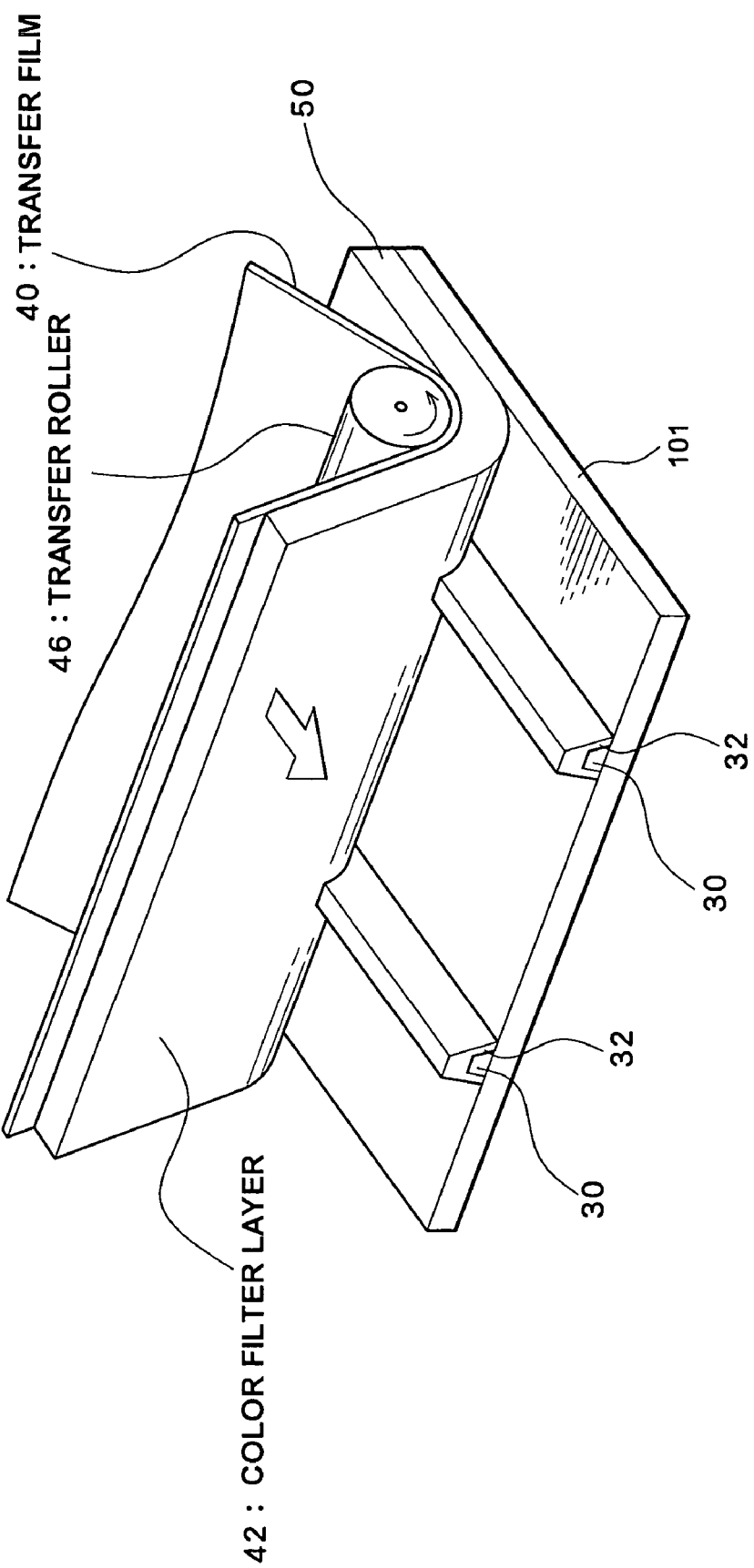
FIG. 12 illustrates a view for explaining a method of forming each color filter in the color organic EL display device according to the second embodiment of the present invention.

According to the second embodiment, in the active matrix organic EL display device described above, the color filter layer 50 is separately provided for each pixel between the planarization insulating film 18 provided under the anode 502 for each pixel and the interlayer insulating film 14, as illustrated in FIGS. 9 and 11, similarly as in the first embodiment. Further, as schematically illustrated in FIG. 9, the protective insulating layer 32 formed as a rib covering each data line 300 disposed in the column direction on the substrate forms a sidewall for forming a color filter. The corresponding color filter layer 50 of R, G, and B is embedded in a pixel region formed using this sidewall as a boundary. Although not illustrated in the figure, when the driving power source line VL 302 formed of the same material as the data line 300 is disposed in parallel thereto, the driving power source line VL 302 is covered with a similar protective insulating layer 32, so that the color filter layer 50 is embedded in the pixel region sectioned by the protective insulating layer 32 covering the data line 300 and the protective insulating layer 32 covering the driving power source line 302. However, the driving power source line 302 may be formed of a layer provided in common to all the pixels, and in such a case the protective insulating layer 32 covering the data line 300 functions as a boundary, as illustrated in FIG. 12.

The color filter layer 50 is formed similarly as in the first embodiment. As illustrated in FIG. 12, the color filter layer 42 provided on the transfer film 40 is pressed against the substrate 101 by means of the transfer roller 46, which is moved forward in the direction in which the protective insulating layer extends, thereby transferring the color filter layer 50 onto the substrate (actually onto the interlayer insulating film 14).

The color filter layer 50 formed in this manner is not mixed with the color filter layer 50 for another color because they are separated by the protective insulating layer 32 formed between the layers in adjoining columns to act as a barrier, and can be formed in a sharp pattern under the anode 502 of each organic EL element 500. When the color filter layer 50 is thus provided on the substrate where the organic EL element 500 is formed, the organic EL element 500 for each pixel can be formed of, for example, a material in common to all the pixels. In connection with the example illustrated in FIG. 9, an organic material capable of emitting white light, for example, can be used for the emissive layer 506 formed in an individual pattern for each pixel. White light can be obtained by injecting, to the above-described emissive layer 506 capable of emitting white light, holes from the anode 502 through the hole transport layer 504, and electrons from the cathode 520 through the electron transport layer 508. Such white light is transmitted through the transparent anode 502 and then the color filter layer 50 of R, G, or B, and through the transparent substrate 101 to outside as desired light of R, G, or B, to thereby achieve full color display. When the color filter layer 50 is provided with a function for converting to a desired color, elements emitting light of any other color can be used for all the pixels. In the structure of FIG. 9, the anode 502 of the organic EL element 500 for each pixel is separated from the anode 502 of the organic EL element 500 for an adjacent pixel by a second planarization insulating layer 518. Also in this embodiment, the active layer (216*d*) of the second TFT 200 is connected to the anode 502 of the organic EL element 500 through the very deep contact hole C2, and the color block layer 36 is preferably formed near the region where the contact hole C2 is formed similarly to the first embodiment, as illustrated in FIG. 11.

Third Embodiment

Figure 13:
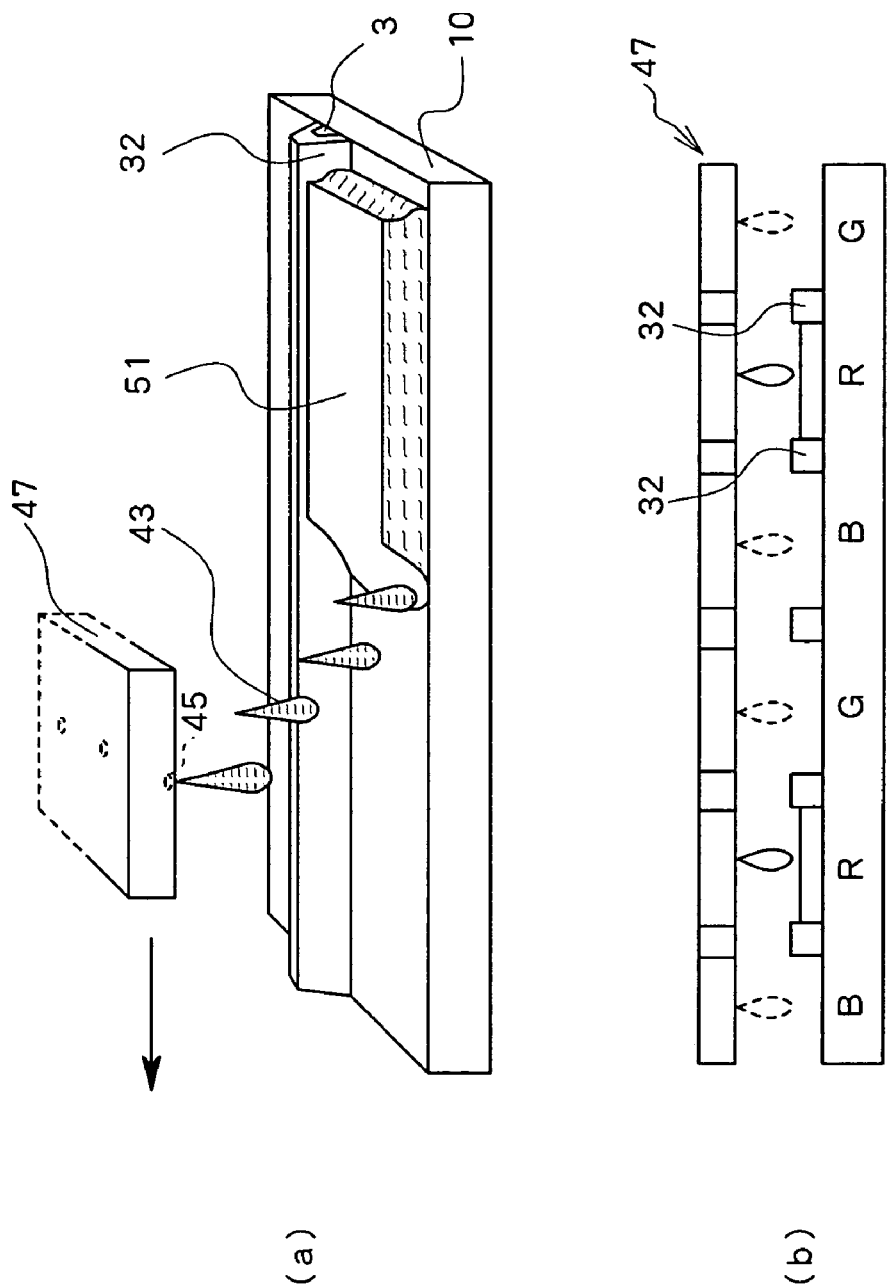
FIG. 13 illustrates a view for explaining a method of forming a color filter according to a third embodiment of the present invention.

FIG. 13 illustrates a concept of forming a color filter layer 51 according to a third embodiment of the present invention. In the first and second embodiments described above, the color filter layer 42 formed on the transfer film 40 is transferred to the substrate using the transfer roller 46, thereby embedding the color filter layer 50 in each pixel region, as illustrated in FIG. 6. On the other hand, in the third embodiment, an ink jet printing method is employed in which a discharging device 47 similarly to that in an ink jet printer is used for discharging a liquid color filter material 43 toward the pixel region. It should be noted, however, that the color filter layer 51 is formed using as a barrier the protective insulating layer 32 formed as a rib and separating the respective pixel regions in the column direction, similarly as in the above first and second embodiments.

The illustrated discharging device 47 includes a nozzle head having small nozzle holes 45 arranged therein, and a drop 43 of the liquid color filter material can be selectively discharged from each nozzle hole 45. According to the third embodiment, the discharging device 47 is positioned with respect to the substrate 10 so that the nozzle holes 45 are arranged perpendicular to the protective insulating layer 32 extending in the column direction, and the color filter material 43 of the corresponding color is selectively discharged from the corresponding nozzle hole 45 to the pixel formation region provided in the form of a groove using the protective insulating layer 32 as a barrier separating the pixels in adjoining columns.

By selectively discharging the color filter material 43 of the corresponding color to the region (groove region) of the same color from the nozzle hole 45, the color filter layer 51 necessary for each pixel region can be formed with the required minimum color filter material 43. It is, of course, possible to use a method where the color filter material 43 for red, for example, is first discharged to the entire region and solidified through, for example, annealing to form the R color filter layer 51, and then the R color filter layer 51 is removed from the unnecessary regions, followed by similar formation of the G and B color filter layers 51, as illustrated in FIG. 7. However, discharging the color filter material 43 of the corresponding color only to the corresponding region from the nozzle hole is preferable from the viewpoint of material cost reduction.

Such a method ensures that the liquid color filter material 43 is accumulated in the groove region for pixel formation having the protecting insulating layer 32 as a sidewall, thereby providing a sufficiently thick color filter layer 51 by solidifying the material. In addition to the fact that the pixel formation regions for different colors disposed in adjoining columns are separated by the protective insulating layer 32, according to the third embodiment the discharging device 47 discharges the color filter material 43 while moving in the direction in which the protective insulating layer 32 extends (in the column direction) similarly to the above-described first and second embodiments (alternatively, the substrate may be moved). Therefore, it is possible to reliably prevent the color filter material 43 of one color from being mixed with that of another color discharged to the pixel formation region in the adjacent column from the discharging device 47.

Fourth Embodiment

Figure 14:
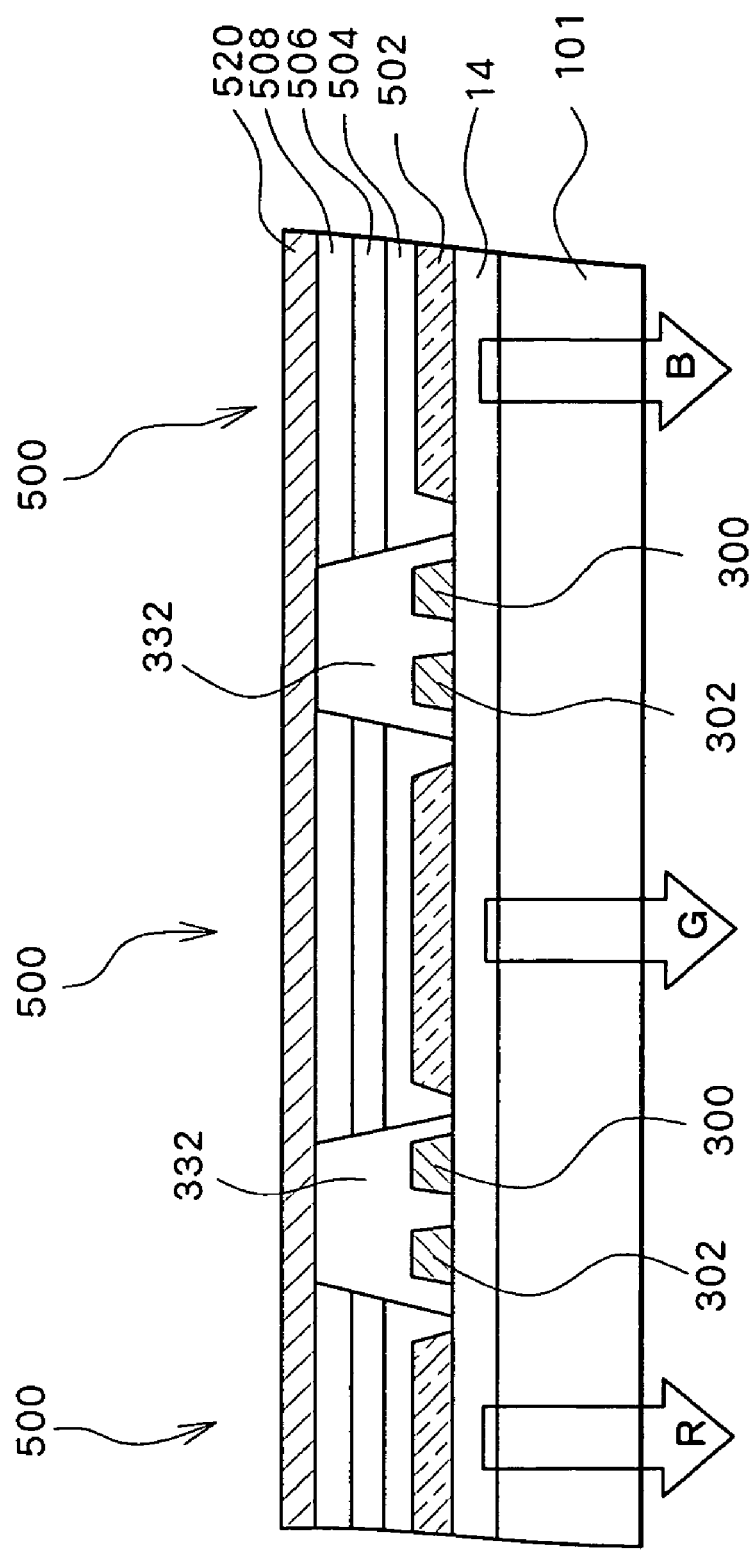
FIG. 14 schematically illustrates a cross sectional structure of a color organic EL display device according to a fourth embodiment of the present invention.
Figure 15:
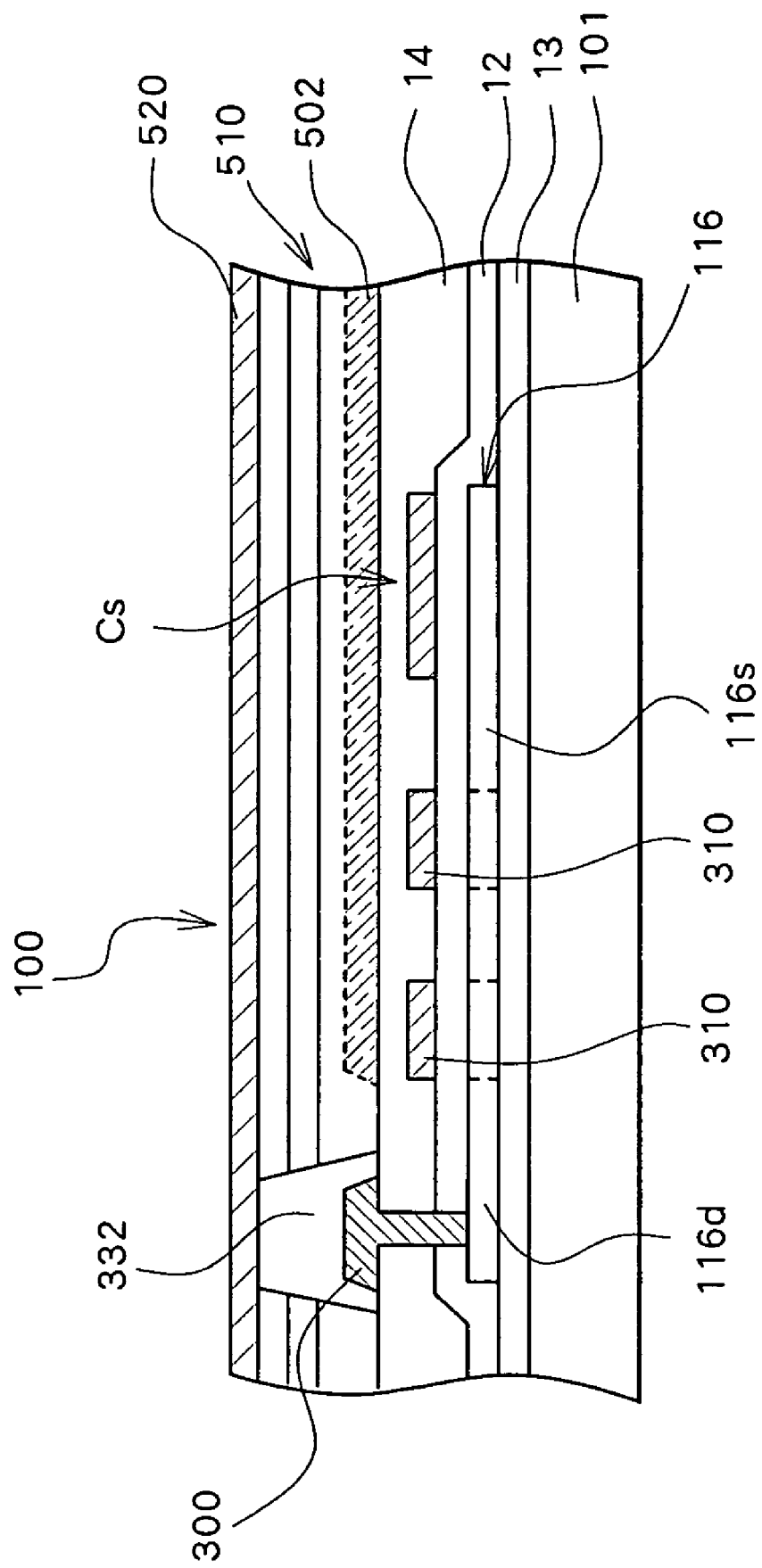
FIG. 15 schematically illustrates a cross sectional structure of a region surrounding a first TFT 100 and a storage capacitor Cs, which are the components for each pixel of the color organic EL display device according to the fourth embodiment of the present invention.

In a fourth embodiment of the present invention, the emissive element layer used in devices such as the color organic EL display device described in connection with the second embodiment is formed by a printing method similar to the method for the color filter layer described in the respective embodiments above. FIG. 14 schematically illustrates a cross sectional structure of each pixel of a color organic EL display device according to the fourth embodiment. The circuit structure of each pixel in this display device is the same as that in FIG. 8 referred to in the above description. FIG. 15 illustrates a cross sectional structure of an area surrounding the region for forming the first TFT 100 connected to the data line 300 for each pixel.

According to the fourth embodiment, the data line 300 for supplying a data signal to each pixel and the driving power source line 302 provided in parallel to the data line 300 are covered with a protective insulating layer 332. (The driving power source line 302 is not illustrated in FIG. 15.)

A sufficient thickness can be secured for the protective insulating layer 332 by using an acrylic resin or the like similarly to the protective insulating layer 32 in the first embodiment. The layer 332 protects the data line 300 and the driving power source line 302, and separates pixels of different colors in adjoining columns. The driving power source line 302 may be formed in another layer in common to the respective pixels, and may not be formed of the same material layer as the data line 300, in which case a plurality of pixels are sectioned by the protective insulating layer 332 covering the data line 300 for each column.

As illustrated in FIG. 14, the anode 502 of each organic EL element 500 is formed on the interlayer insulating film 14 (a planarization insulating layer may further be formed). The above-described protective insulating layer 332 is provided in a protruding manner on either side of the anode 502 in the column direction, sectioning the pixel formation regions in adjacent columns. Instead of, for example, the color filter layer 42 illustrated in FIG. 12, the transfer film 40 to which is attached the respective material layers forming the emissive element layer 510 (the hole transport layer 504, the emissive layer 506, and the electron transport layer 508 in this example) is used and pressed against the substrate 101 with the transfer roller 46, so that the transfer film 40 is transferred onto the substrate (anode 502) in the direction where the protective insulating layer 332 extends. To the pixel regions emitting different colors and located adjacent to each other, the transfer film 40 to which the corresponding different materials are attached is used and transferred.

By thus employing the method of embedding the emissive element layer in pixel formation regions by the transfer method using the sufficiently thick protective insulating layer 332, the materials can be prevented from mixing at pixels in adjoining columns, even when different emissive element materials are used for these pixels, and the emissive element materials are clearly separated from each other at the adjoining pixels. As a result, light with high color purity can be emitted in each organic EL element 500. It should be noted that the emissive element layer 510 at least includes an emissive material (emissive layer) as described above, and that, when the organic EL element 500 emits different colors, the emissive layer is formed of materials different for each emitted color. Accordingly, at least for the emissive layer, the protective insulating layer 332 is advantageously used for separating adjoining columns assigned different colors.

Further, in the fourth embodiment, the protective insulating layer 332 preferably has a thickness such that the upper surface of the emissive element layer 510 for each pixel is flush with the upper surface of the protective insulating layer 332 because the layer 332 forms a boundary between adjoining pixels when the emissive element layer 510 is formed. An excessively thick layer is not preferable because it results in a difference in levels at the cathode 520 of the organic EL element 500 formed in common to the respective pixels on the emissive element layer 510.

Further, in the fourth embodiment, the color filter layer 50 may be formed under the anode 502 of each organic EL element 500 as in the second embodiment illustrated in FIG. 9, and the emissive element layer 510 of the organic EL element 500 may be formed by the printing method using the similar protective insulating layer 332 as a sidewall.

Figure 16:
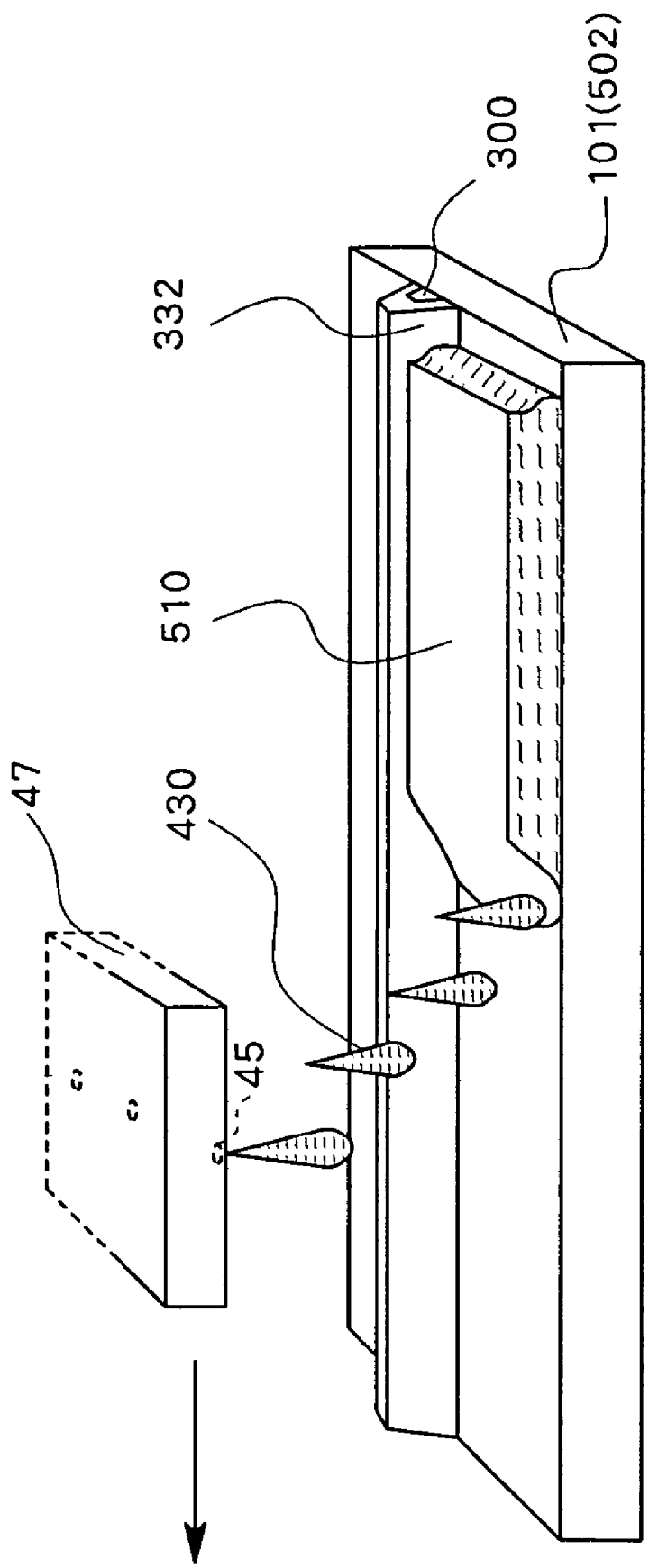
FIG. 16 illustrates a view for explaining an exemplary method of forming an emissive element layer in the color organic EL display device according to the fourth embodiment of the present invention.

The emissive element layer 510 may be formed through printing by the ink jet method described in connection with the above third embodiment. FIG. 16 illustrates a concept of forming the emissive element layer 510 through the ink jet method.

When, for example, a macromolecular emissive material or the like is used as a material for the emissive element layer, the layer can be formed on the substrate by discharging the macromolecular emissive material in a liquid state using the discharging device 47 according the so-called ink jet method, as illustrated in FIG. 16. An emissive element layer 510 composed only of the high molecular weight emissive material layer is also commonly observed.

In such a case, as the protective insulating layer 332 is formed covering the data line 300 as described above, the emissive element layer 510 can be formed very simply without blur by discharging an emissive element material 430 from the discharging device 47 to the pixel formation region sectioned for each column of an identical color using the protective insulating layer 332 as a sidewall. While pixels of different colors are usually disposed proximate to each other with the data line 300 (and the driving power source line 302 when formed) acting as a boundary, even with such a structure, the liquid emissive element material 430 can be reliably prevented from flowing into and mixing in the pixel formation region in an adjacent column. Similarly as in the third embodiment, the discharging device 47 is relatively moved in the direction where the protective insulating layer 332 extends (the column direction in this example), so that the likelihood that the emissive element material 430 of an unintended color, for example, drops from the nozzle hole 45 is diminished, thereby further helping to prevent mixture of emissive element materials of different colors. Further, because the direction of movement of the discharging device 47 coincides with the direction in which the protective insulating layer 332 extends, the emissive element material 430 can be accurately and reliably dropped to a corner region of the surface of the substrate 101 (anode 502) and the sidewall of the pixel formation region formed by the protective insulating layer 332, thereby preventing a flaw in the emissive element pattern.

Further, by employing a method of selectively discharging the corresponding emissive element material of R, G, or B from the nozzle hole 45 to a corresponding position simultaneously or separately for each color of R, G, and B, the respective emissive element layers of R, G, and B can be formed with the minimum amount of materials, significantly contributing to reduction in material costs.

While the protective insulating layers 32 and 332 have been described as covering the data line in the above embodiments, the data line need not be directly covered when the data line is not exposed at the surface where the protective insulating layers 32 and 332 is formed for, for example, convenience of manufacturing steps. However, also in such a structure, the above-described protective insulating layer is disposed as a rib-shaped insulating layer extending on the boundary of pixel regions assigned different colors and located adjacent to each other, and the rib-shaped insulating layer forms a sidewall located on either side of each pixel space in the column direction, so that in such a pixel space the emissive element layer and the color filter of the assigned color are formed. Also with such a structure, the color filter and the emissive element layer can be formed without being mixed with those of different colors similarly as in the above-described embodiments. The color filter and the emissive element layer can be formed through the above-described transfer method, discharging method, or the like, and the mixing of different color materials can be simply and reliably prevented irrespective of the method employed. For example, when in the structure of FIG. 15 the planarization insulating layer 18 as illustrated in FIG. 11 is formed covering the interlayer insulating film 14 and the data line 300 and the anode 502 of the organic EL element 500 is formed thereon, a rib-shaped insulating layer having a sufficient height as the protective insulating layer 332 in FIG. 15 is formed over the region where the data line 300 is formed. Using this rib-shaped insulating layer as a sidewall for an emissive region, the emissive element layer is formed at this space through the inkjet or transfer method.

EFFECTS OF THE INVENTION

As described above, according to the present invention, transfer of a color filter or discharge of a color filter material is performed in the direction in which a rib-shaped protective insulating layer covering the wiring extends. As a result, the color filter or an emissive element layer can be formed embedded between the protective insulating layers without any gaps while expelling the ambient gas in the transfer direction or the direction in which the discharging device is moved.

Because the color filter is formed on the protective insulating layer covering the wiring, it is possible to prevent degradation of the wiring through exposure to the processing solution or ambient air during the step of patterning the color filter.

Further, because the protective insulating layer is formed as a rib, the insulating layer acts as a boundary wall between adjoining pixels, thereby preventing mixture of emissive element layers or color filter materials of different colors near the boundary.

Further, according to the present invention, the data line is covered with the protective insulating layer, so that degradation of the data line during the step of forming the color filter is prevented while employing an on-chip color filter method with less color blur, and that mixture of color filter materials of different colors can be reliably prevented between adjoining pixels with the protective insulating layer acting as a boundary therebetween. Consequently, color display with high display quality can be achieved.

Further, according to the present invention, the protective insulating layer formed as a rib as described above is used as a boundary wall between pixel formation regions, and a layer of the emissive element material and the like of the organic EL element is formed at this region through a method such as the above-described transfer or discharge method, thereby forming the emissive element layer without mixture of materials for different colors.

INDUSTRIAL APPLICABILITY

The present invention is suitable for use in color display devices, such as a color liquid crystal display device and a color EL display device.

The invention claimed is:

1. A method of manufacturing a color display device, the method comprising:
    providing on a substrate, a plurality of switching elements, a data line for supplying a data signal to a corresponding switching element among said plurality of switching elements, a selection line for supplying a selection signal to said corresponding switching element, a pixel electrode directly or indirectly connected to said corresponding switching element, and a color filter formed under said pixel electrode;
    forming said selection line, said switching element, and said data line on said substrate, and then forming a protective insulating layer at least covering each said data line extending in a column direction and protruding from said substrate as a rib;
    affixing a color filter layer on a transfer film onto said substrate through pressure applied by a pressing mechanism; and
    moving the pressing mechanism in a direction in which said protective insulating layer extends, thereby transferring said color filter layer to be embedded into a corresponding display space for a pixel with said protective insulating layer on said substrate serving as a sidewall of a passage for expelling ambient gas in the column direction during transfer of the color filter.

2. A method of manufacturing a color display device according to claim 1, wherein, prior to transfer of said color filter,
    forming a color filter block layer near a region for forming a contact hole for electrically connecting layers of said pixel electrode and said switching element, and
    securing said passage for expelling ambient gas in the column direction during transfer of the color filter between the color filter block layer and said protective insulating layer.

3. A method of manufacturing a color display device according to claim 1, wherein
    said color display device is a color liquid crystal display device for controlling liquid crystal by a voltage corresponding to the data signal applied to said pixel electrode.

4. The method of manufacturing a color display device according to claim 1, wherein
    said color display device is a color electroluminescence display device comprising an electroluminescence element for each pixel, said pixel electrode is a first electrode of said electroluminescence element, and emissive intensity of said electroluminescence element is controlled in accordance with electric power corresponding to the data signal supplied to the first electrode.

5. A method of manufacturing a color display device, the method comprising:
    providing on a substrate, a plurality of switching elements, a data line for supplying a data signal to a corresponding switching element among said plurality of switching elements, a selection line for supplying a selection signal to said corresponding switching element, a pixel electrode directly or indirectly connected to said corresponding switching element, and a color filter formed under said pixel electrode;
    forming said selection line, said switching element, and said data line on said substrate, and then forming a protective insulating layer covering at least each said data line extending in a column direction and protruding from said substrate as a rib;
    forming a color filter block layer near a region for forming a contact hole for electrically connecting layers of said pixel electrode and said switching element;
    securing a passage for expelling ambient gas in the column direction during transfer of a color filter layer between the color filter block layer and said protective insulating layer;
    affixing the color filter layer on a transfer film onto said substrate through pressure applied by a pressing mechanism; and
    moving the pressing mechanism in a direction in which said protective insulating layer extends, thereby transferring said color filter layer onto said substrate.

* * * * *

UNITED STATES PATENT AND TRADEMARK OFFICE
CERTIFICATE OF CORRECTION

PATENT NO. : 7,361,248 B2  Page 1 of 1
APPLICATION NO. : 11/399864
DATED : April 22, 2008
INVENTOR(S) : Matsuoka et al.

It is certified that error appears in the above-identified patent and that said Letters Patent is hereby corrected as shown below:

Title Page
Item (30), Foreign Application Priority Data:

Delete "Oct. 10, 2000 (JP).......2003-11495" and insert
--Oct. 12, 2000 (JP).......2000-311495--; and Delete "Oct. 10, 2000 (JP)........2003-11499" and insert
--Oct. 12, 2000 (JP)......2000-311499--.

Column 1
Line 15, after "Nos." Delete "200311495 and 200311499" and insert therefor
--2000-311495 and 2000-311499--

Line 16, after "on" Delete "Oct. 10, 2000" and insert therefor --Oct. 12, 2000--

Signed and Sealed this

Sixth Day of October, 2009

David J. Kappos
*Director of the United States Patent and Trademark Office*